(12) United States Patent
Suzuki et al.

(10) Patent No.: US 12,061,239 B2
(45) Date of Patent: Aug. 13, 2024

(54) BATTERY SYSTEM, VEHICLE INCLUDING THE SAME, AND METHOD FOR MONITORING SECONDARY BATTERY

(71) Applicant: TOYOTA JIDOSHA KABUSHIKI KAISHA, Toyota (JP)

(72) Inventors: Kentaro Suzuki, Kariya (JP); Daisuke Okanishi, Miyoshi (JP); Hiroki Nagai, Ama-gun (JP); Yoshiki Sugino, Seto (JP); Nobuyuki Tanaka, Toyota (JP); Yuki Sugo, Toyota (JP); Shunya Kobayashi, Toyota (JP); Ryo Inoue, Toyota (JP); Takahiro Noguchi, Miyoshi (JP); Ryota Takizawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 133 days.

(21) Appl. No.: 17/987,955

(22) Filed: Nov. 16, 2022

(65) Prior Publication Data
US 2023/0194619 A1 Jun. 22, 2023

(30) Foreign Application Priority Data

Dec. 20, 2021 (JP) .................. 2021-206078

(51) Int. Cl.
*G01R 31/389* (2019.01)
*G01R 31/36* (2020.01)
*G01R 31/388* (2019.01)
*H01M 10/42* (2006.01)
*H01M 10/48* (2006.01)
*H02J 7/00* (2006.01)

(52) U.S. Cl.
CPC ....... *G01R 31/389* (2019.01); *G01R 31/3646* (2019.01); *G01R 31/388* (2019.01); *H01M 10/425* (2013.01); *H01M 10/486* (2013.01); *H02J 7/0048* (2020.01); *H02J 7/005* (2020.01); *H02J 7/007182* (2020.01); *H01M 2220/20* (2013.01); *H02J 2207/20* (2020.01)

(58) Field of Classification Search
None
See application file for complete search history.

(56) References Cited

U.S. PATENT DOCUMENTS

2011/0084702 A1  4/2011  Mori
2011/0279088 A1* 11/2011  Yamamoto ............ H01M 10/48
                                                      320/136

FOREIGN PATENT DOCUMENTS

JP  2011-103291 A  5/2011
JP  2013-221790 A  10/2013
JP  2015-121449 A  7/2015

* cited by examiner

*Primary Examiner* — Jas A Sanghera
(74) *Attorney, Agent, or Firm* — Dinsmore & Shohl LLP

(57) ABSTRACT

The battery system includes a secondary battery, a voltage sensor, a current sensor, a temperature sensor, and a processor. The processor is configured to calculate a polarization overvoltage by subtracting a voltage drop amount caused by a DC resistance and a reactive resistance of the secondary battery determined in accordance with a temperature and an SOC of the secondary battery from a voltage difference between OCV and CCV of the secondary battery.

11 Claims, 14 Drawing Sheets

<< BATTERY DISCHARGE >>

<< DISPLAY OF SURFACE SOC >>

TIME

<< DISPLAY OF THE POLARIZATION LEVEL >>

POLARIZATION MAXIMUM   POLARIZATION RELAXATION   DEPOLARIZATION

TIME

BATTERY SYSTEM, VEHICLE INCLUDING THE SAME, AND METHOD FOR MONITORING SECONDARY BATTERY

CROSS-REFERENCE TO RELATED APPLICATION

This application claims priority to Japanese Patent Application No. 2021-206078 filed on Dec. 20, 2021, incorporated herein by reference in its entirety.

BACKGROUND

1. Technical Field

The present disclosure relates to a battery system, a vehicle including the same, and a method of monitoring a secondary battery.

2. Description of Related Art

Japanese Unexamined Patent Application Publication No. 2013-221790 (JP 2013-221790 A) describes that the internal resistance of a battery is the sum of a direct current (DC) resistance component and a polarization resistance component saturated to a constant value. JP 2013-221790 A also describes calculating a value of a polarization resistance component based on a terminal voltage and an estimated value of the DC resistance component.

SUMMARY

It is known that polarization of the secondary battery can occur when the secondary battery is discharged with a large current or when the secondary battery is continuously discharged. When polarization occurs, the amount of decrease in the voltage (closed circuit voltage) of the secondary battery increases by the amount of voltage drop due to polarization. As a result, there is a possibility that the secondary battery cannot be properly protected, such as when the secondary battery is overdischarged. Therefore, there is always a demand to accurately calculate the voltage drop amount due to polarization of the secondary battery.

The present disclosure has been made to solve the above problem, and an object of the present disclosure is to accurately calculate a voltage drop amount due to polarization caused by discharge of a secondary battery.

A battery system according to a first aspect of the present disclosure includes: a secondary battery; a voltage sensor for detecting a closed circuit voltage of the secondary battery; a current sensor for detecting a discharge current from the secondary battery; a temperature sensor for detecting a temperature of the secondary battery; and a processor for calculating a polarization overvoltage due to discharge of the secondary battery, based on a detection result of the voltage sensor, the current sensor, and the temperature sensor. In this case, the processor is configured to calculate the polarization overvoltage by subtracting a voltage drop amount caused by a direct current resistance and a reactive resistance of the secondary battery determined in accordance with a temperature and a state of charge of the secondary battery from a voltage difference between an open circuit voltage of the secondary battery and the closed circuit voltage detected by the voltage sensor.

The battery system according to the first aspect further includes a memory in which a correlation between the temperature of the secondary battery, the state of charge of the secondary battery, and a sum of the direct current resistance and the reactive resistance of the secondary battery is defined. In this case, the processor is configured to calculate the sum based on the temperature detected by the temperature sensor and the state of charge of the secondary battery by referring to the correlation, and calculate the voltage drop amount caused by the direct current resistance and the reactive resistance of the secondary battery by multiplying the sum by the discharge current detected by the current sensor.

In the battery system according to the first aspect, the correlation is defined using the sum when the discharge current from the secondary battery changes over a time period longer than a predetermined time period, and the predetermined time period is longer than a time period in which the direct current resistance and the reactive resistance of the secondary battery are able to follow a change in the discharge current from the secondary battery, and is shorter than a time period in which a diffusion resistance of the secondary battery is able to follow a change in the discharge current from the secondary battery.

In the battery system according to the first aspect, the correlation is defined for each deterioration index indicating a degree of deterioration of the secondary battery, and the processor is configured to calculate the sum based on the deterioration index in addition to the temperature detected by the temperature sensor and the state of charge of the secondary battery by referring to the correlation.

A vehicle according to a second aspect of the present disclosure includes: the battery system described above; and a power conversion device configured to discharge the secondary battery. In this case, the processor is configured to subtract the polarization overvoltage from the open circuit voltage of the secondary battery to calculate a surface voltage of the secondary battery, the surface voltage being a voltage that decreases as polarization of the secondary battery progresses, and control the power conversion device so as to suppress discharge power from the secondary battery in accordance with the surface voltage.

In the vehicle according to the second aspect, the processor calculates a surface state of charge based on the surface voltage, and controls the power conversion device so as to suppress the discharge power from the secondary battery based on the surface state of charge. The surface state of charge is a parameter representing the state of charge in a polarization state of the secondary battery by the state of charge in an unloaded state with an equivalent discharging capability.

The vehicle according to the second aspect further includes a display device. In this case, the processor is configured to control the display device to cause the display device to display a polarization level of the secondary battery in accordance with the polarization overvoltage.

The vehicle according to the second aspect further includes a display device. In this case, the processor is configured to control the display device to display the surface state of charge.

The vehicle according to the second aspect further includes a display device. In this case, the processor is configured to control the display device to cause the display device to display an upper limit discharge power from the secondary battery, the upper limit discharge power being set in accordance with the surface state of charge.

The vehicle according to the second aspect further includes a display device. In this case, the processor is configured to calculate a travel time during which the vehicle is able to maintain a current vehicle speed, and to control the display device to cause the display device to display a calculated result.

A method for monitoring a secondary battery by a computer includes: calculating, by the computer, a difference between an open circuit voltage and a closed circuit voltage of the secondary battery; calculating, by the computer, a voltage drop amount caused by a direct current resistance and a reactive resistance of the secondary battery determined in accordance with a temperature and a state of charge of the secondary battery; and calculating, by the computer, a polarization overvoltage that is a voltage drop amount due to polarization caused by discharge of the secondary battery, by subtracting the voltage drop amount from the difference.

According to the present disclosure, it is possible to accurately calculate a voltage drop amount due to polarization caused by discharge of a secondary battery.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
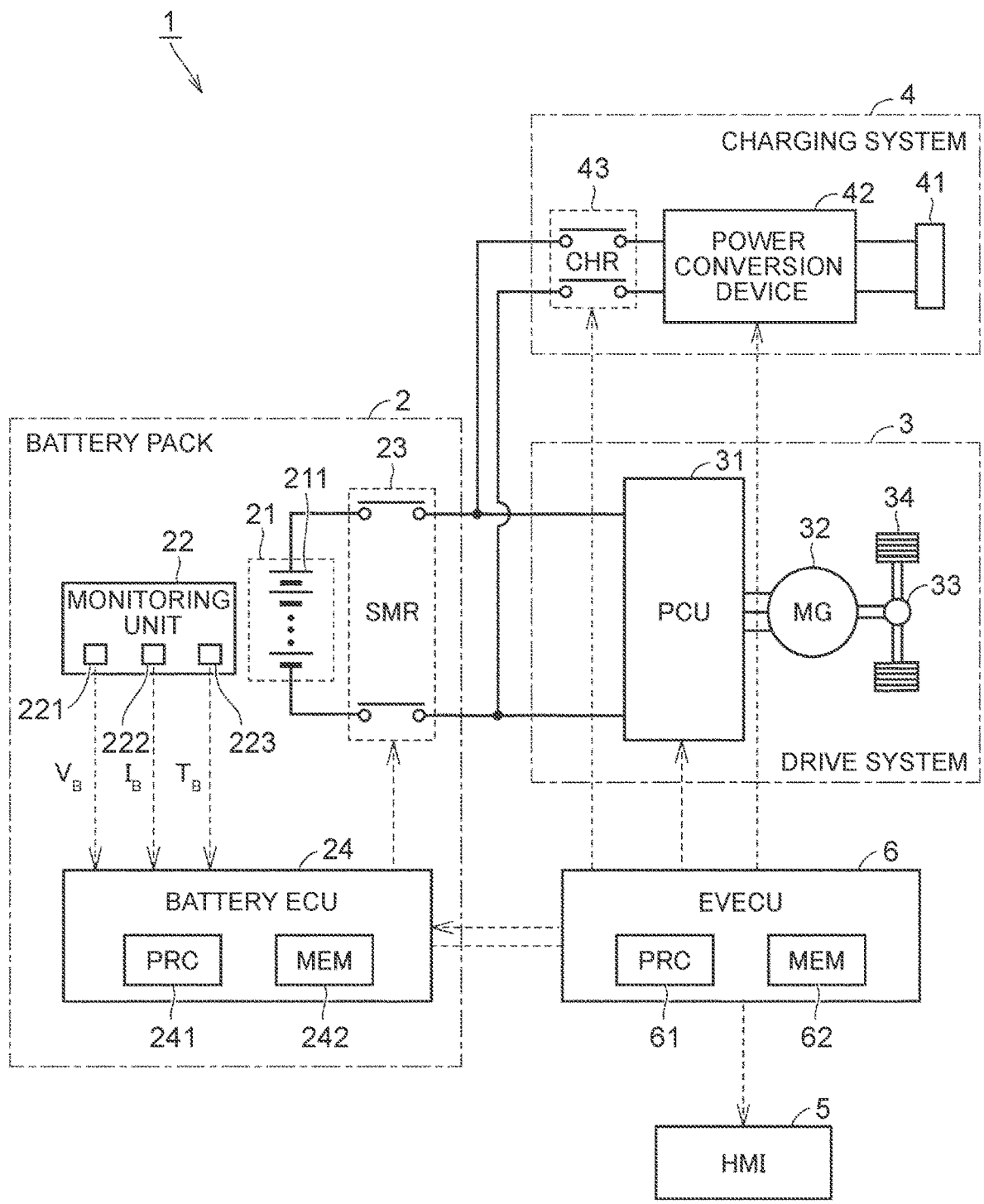
FIG. 1 is a diagram schematically showing an overall configuration of a vehicle in which a battery system according to a first embodiment of the present disclosure is mounted.

Hereinafter, embodiments of the present disclosure will be described in detail with reference to the drawings. It should be noted that the same or corresponding portions in the drawings are designated by the same reference signs and repetitive description will be omitted.

Hereinafter, a configuration in which the battery system according to the present disclosure is mounted on a vehicle will be described as an example. However, the use of the battery system according to the present disclosure is not limited to a vehicle, and may be another use such as a stationary use.

First Embodiment

Vehicle Configuration

FIG. 1 is a diagram schematically showing an overall configuration of a vehicle in which a battery system according to a first embodiment of the present disclosure is mounted. The vehicle 1 is, for example, a battery electric vehicle (BEV). However, the vehicle on which the battery system according to the present disclosure can be mounted is not limited to a battery electric vehicle. The battery system according to the present disclosure can be mounted on a vehicle in general in which a driving force is generated by using electric power supplied from the battery system. The vehicle 1 may be a hybrid electric vehicle (HEV), a plug-in hybrid electric vehicle (PHEV), or a fuel-cell electric vehicle (FCEV).

The vehicle 1 includes a battery pack 2, a drive system 3, a charging system 4, a Human Machine Interface (HMI) 5, and an Electric Vehicle Electronic Control Unit (EV ECU) 6. The battery pack 2 includes a battery 21, a monitoring unit 22, a system main relay (SMR) 23, and a battery ECU 24. The drive system 3 includes a power control unit (PCU) 31, motor generators 32, power transmission gears 33, and drive wheels 34. The charging system 4 includes an inlet 41, a power conversion device 42, and a charging relay 43.

The battery 21 is a battery pack. The battery 21 includes a plurality of blocks (also referred to as modules). Each of the plurality of blocks includes one or more cells 211. Each cell 211 is a secondary battery, and in the present embodiment, is a lithium ion battery. The battery 21 stores electric power for driving the motor generators 32, and supplies electric power to the motor generators 32 through the PCU 31. The battery 21 receives and is charged with generated electric power through the PCU 31 at the time of power generation of the motor generators 32.

The monitoring unit 22 includes various sensors for monitoring the battery 21. Specifically, the monitoring unit 22 includes a voltage sensor 221, a current sensor 222, and a temperature sensor 223. The voltage sensor 221 detects the voltage $V_B$ of the cells 211. The current sensor 222 detects a current $I_B$ charged to and discharged from the battery 21. In the present embodiment, the discharge current is set to a positive value. The temperature sensor 223 detects a temperature $T_B$ of the battery 21. The sensor outputs a signal indicating the detection result to the battery ECU 24.

SMR 23 is electrically connected to a power line connecting the battery 21 and PCU 31. SMR 23 is opened and closed in accordance with a command from the cell ECU 24.

The battery ECU 24 includes a processor 241 such as a Central Processing Unit (CPU), a memory 242 such as a Read Only Memory (ROM) and a Random Access Memory (RAM), and an input/output port (not shown) through which various signals are input and output. The processor 241 monitors the battery 21 based on the signals received from each sensor and the programs and maps stored in the memory 242. More specifically, the battery ECU 24 calculates State Of Charge (SOCs) of the battery 21 and calculates the polarization overvoltage (described later) of the battery 21. The process of calculating the polarization overvoltage of the battery 21 will be described in detail later.

PCU 31 is electrically connected between SMR 23 and the motor generator 32. PCU 31 includes converters and inverters (neither shown). PCU 31 drives the motor-generator 32 using the discharged power from the battery 21 in accordance with a command from EV ECU 6. Note that PCU 31 is an exemplary "power conversion device" according to the present disclosure.

The motor generator 32 is, for example, a permanent magnet synchronous motor having a rotor in which a permanent magnet is embedded. Output torque of the motor generator 32 is transmitted to the drive wheels 34 through the power transmission gear 33 and causes the vehicle 1 to travel. In addition, the motor generator 32 can generate electric power (regenerative electric power generation) by the rotational force of the drive wheels 34 during the braking operation of the vehicle 1. The electric power generated by the motor generator 32 is converted by the PCU 31 into charging electric power for the battery 21.

The inlet 41 is configured to be capable of connecting a charging connector (not shown) provided at a distal end of the charging cable with a mechanical connection. The connection between the inlet 41 and the charging connector ensures an electrical connection between a charging facility (not shown) and the vehicle 1.

The power conversion device 42 is, for example, an AC/DC converter. The power conversion device 42 converts AC power supplied from the charging facility via the charging cable into DC power in accordance with a command from EV ECU 6, and charges the battery 21 (external charging). Further, the power conversion device 42 can convert the DC power stored in the battery 21 into AC power in accordance with a command from EV ECU 6 and discharge the AC power to an external load (not shown) connected to the inlet 41 (external power supply). Note that the power conversion device 42 at the time of external power supply is another example of the "power conversion device" according to the present disclosure.

The charge relays 43 are electrically connected to a power line connecting SMR 23 and PCU 31. The charge-relay 43 is opened and closed in accordance with a command from EV ECU 6.

HMI 5 includes an input device and a display device (neither of which is shown), and accepts user manipulation and displays various types of information. More specifically, HMI 5 includes, for example, an instrument panel (hereinafter referred to as an "instrument panel"), a Head-Up Display (HUDs), and a navigation-screen. The instrument panel is an instrument panel in which meters are installed. A multi-information display (MID) may also be employed in place of the instrument panel. The HUD projects various kinds of information as a virtual image in front of the field of view of the driver. The navigation screen is a display of the navigation system.

EV ECU 6, like the cell ECU 24, includes a processor 61, memories 62, and input/output ports (not shown). EV ECU 6 comprehensively controls the vehicles 1 based on the signals received from the sensors and the programs and maps stored in the memories 62. For example, EV ECU 6 controls charging and discharging of the battery 21 by controlling PCU 31 or power conversion device 42 in cooperation with the battery ECU 24. Although the battery ECU 24 and EV ECU 6 are configured separately in FIG. 1, the battery ECU 24 and EV ECU 6 may be configured integrally.

<Battery Configuration>

Figure 2:
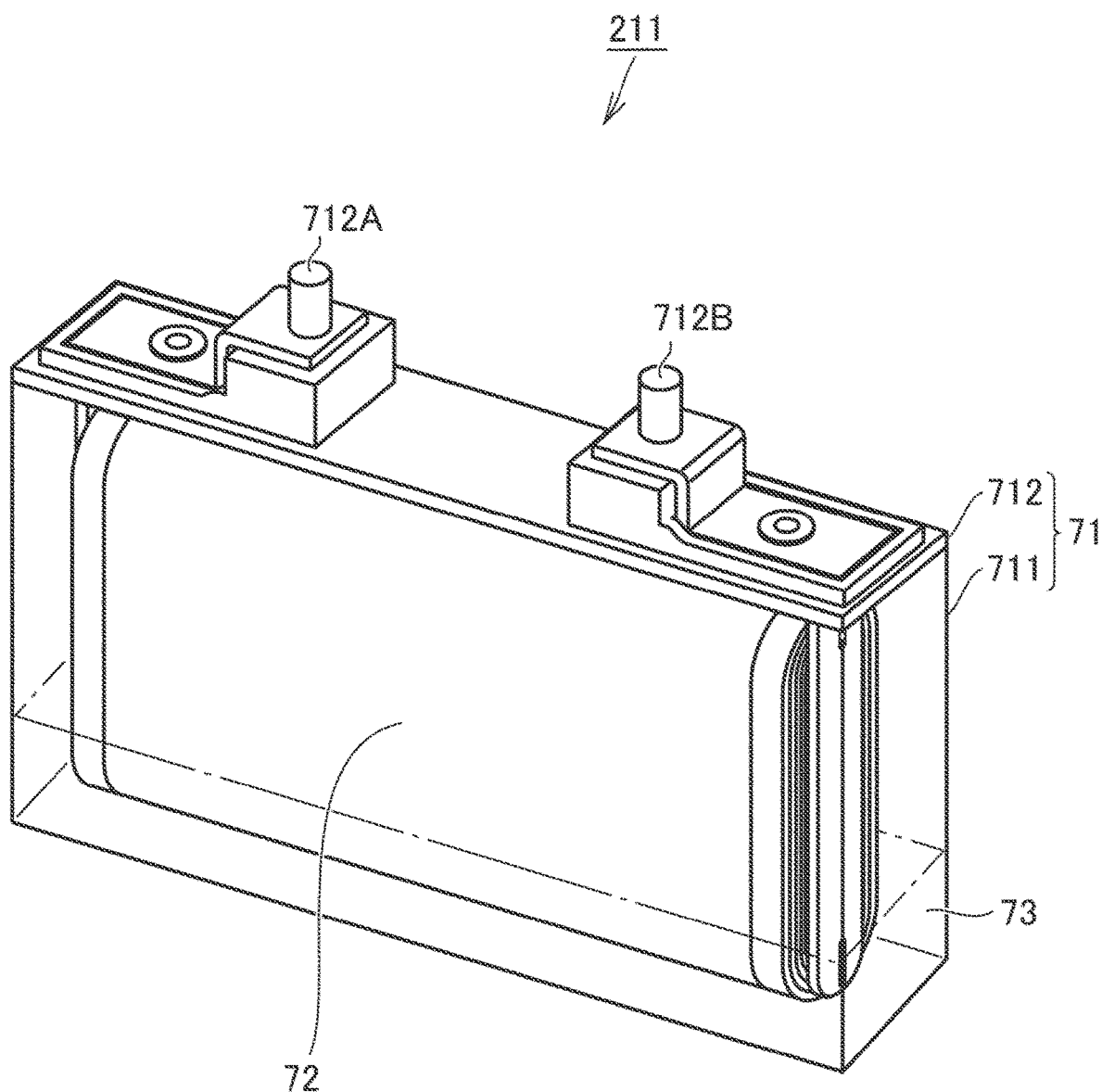
FIG. 2 is a diagram illustrating an example of a configuration of a cell that is a lithium-ion battery.

FIG. 2 is a diagram illustrating an example of a configuration of a cell 211 that is a lithium-ion battery. FIG. 2 shows a perspective view of the inside of the cell 211. Cell 211 is a closed square battery in this example. However, the shape of the cell 211 is not limited to a square shape, and may be, for example, a cylindrical shape. The cell 211 includes a battery case 71, an electrode body 72, and an electrolytic solution 73.

The battery case 71 is made of, for example, an aluminum (Al) alloy. The battery case 71 may be, for example, a pouch made of an Al laminate film. The battery case 71 includes a case main body 711 and a lid 712. The case main body 711 houses the electrode body 72 and the electrolytic solution 73. The case main body 711 has an outer shape of a flat rectangular parallelepiped. The case main body 711 and the lid 712 are joined to each other by, for example, laser welding. The lid 712 is provided with a positive electrode terminal 712A and a negative electrode terminal 712B.

The electrode body 72 is, for example, a wound type. That is, the positive electrode and the negative electrode are alternately stacked with the separator interposed therebetween. Further, the laminated body is wound in a cylindrical shape. The electrolytic solution 73 is injected into the battery case 71 and impregnated into the electrode body 72. In FIG. 1, the liquid level of the electrolytic solution 73 is indicated by a dashed-dotted line.

The positive electrode is a belt-shaped sheet. The positive electrode includes a positive electrode current collector and a positive electrode mixture layer. The positive electrode current collector is electrically connected to the positive electrode terminal 712A. The positive electrode current collector is, for example, an aluminum (Al) foil or an Al alloy foil. The positive electrode mixture layer is formed on the surface of the positive electrode current collector. The positive electrode mixture layer may be formed on both surfaces of the front surface and the back surface of the positive electrode current collector. The positive electrode mixture layer includes a positive electrode active material, a conductive material, a binder, and a flame retardant.

Positive active materials are, for example, $LiCoO_2$, $LiNiO_2$, $LiNi_{1/3}Co_{1/3}Mn_{1/3}O_2(NCM)$, $LiNi_{0.8}Co_{0.15}Al_{0.05}O_2(NCA)$, $LiMnO_2$, $LiMn_2O_4$, $LiFePO_4$. Examples of the conductive material include acetylene black (AB), furnace black, vapor-grown carbon fiber (VGCF), and graphite. The binder is, for example, polyvinylidene fluoride (PVdF), styrene-butadiene rubber (SBR), polytetrafluoroethylene (PTFE). Flame retardants include, for example, phosphorus (P) or sulfur (S).

The negative electrode is a belt-shaped sheet. The negative electrode includes a negative electrode current collector and a negative electrode mixture layer. The negative electrode current collector is electrically connected to the negative electrode terminal 712B. The negative electrode current collector is, for example, a copper (Cu) foil. The negative electrode mixture layer is formed on the surface of the negative electrode current collector. The negative electrode mixture layer may be formed on both surfaces of the front surface and the back surface of the negative electrode current collector. The negative electrode mixture layer includes a negative electrode active material and a binder.

The negative electrode active material is a graphite-based material. Specifically, the negative electrode active material is amorphous coat graphite), graphite, graphitizable carbon, or non-graphitizable carbon. The binder is, for example, carboxymethylcellulose (CMC), styrene-butadiene rubber (SBR).

The separator is a strip of film. The separator is disposed between the positive electrode and the negative electrode, and electrically insulates the positive electrode and the negative electrode. The material of the separator is a porous material, for example polyethylene (PE), polypropylene (PP).

The electrolytic solution 73 includes a lithium (Li) salt and a solvent. The Li salt is a support electrolyte dissolved in a solvent, for example, $LiPF_6$, $LiBF_4$, $Li[N(FSO_2)_2]$, $Li[N(CF_3SO_2)_2]$. One Li salt may be used alone, or two or more Li salts may be used in combination. The solvent is aprotic. Solvents are, for example, mixtures of cyclic carbonates and linear carbonates. The electrolytic solution 73 may further comprise functional additives such as Solid Electrolyte Interface (SEI) film formers in addition to Li-salts and solvents.

In the present embodiment, the specific configuration (the number of cells, the manner of connecting the cells, and the like) of the battery 21 is not particularly limited. Therefore, for the sake of simplicity of explanation, the control target of charging and discharging by the battery ECU 24 and the monitoring target by the monitoring unit 22 will be simply referred to as "battery 21" hereinafter.

<Polarization with Discharge>

Figure 3:
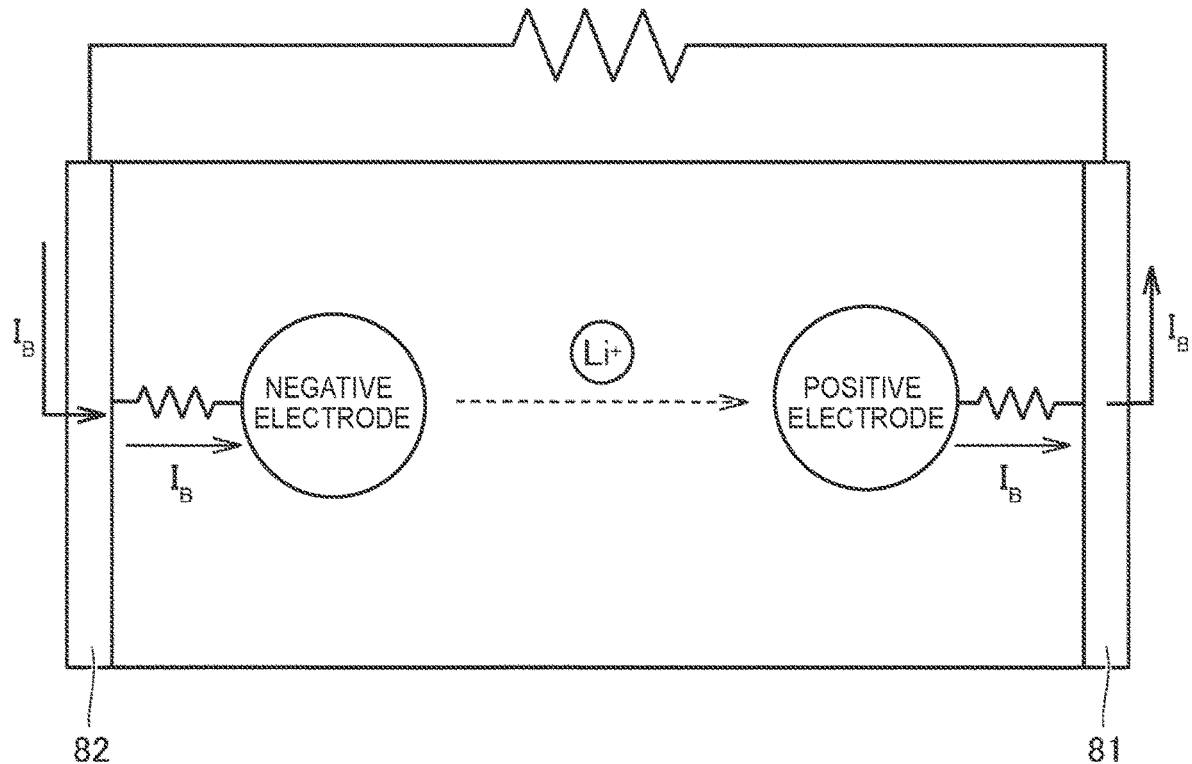
FIG. 3 is a diagram schematically illustrating a discharging mechanism of a battery.

FIG. 3 is a diagram schematically illustrating a discharging mechanism of the battery 21. When the battery 21 is discharged, lithium ions (denoted by Li$^+$) are desorbed from the negative electrode, while lithium ions are inserted into the positive electrode. Hereinafter, a description will be given using a "one-particle model" in which a positive electrode active material included in a positive electrode is schematically represented by one particle.

Figure 4:
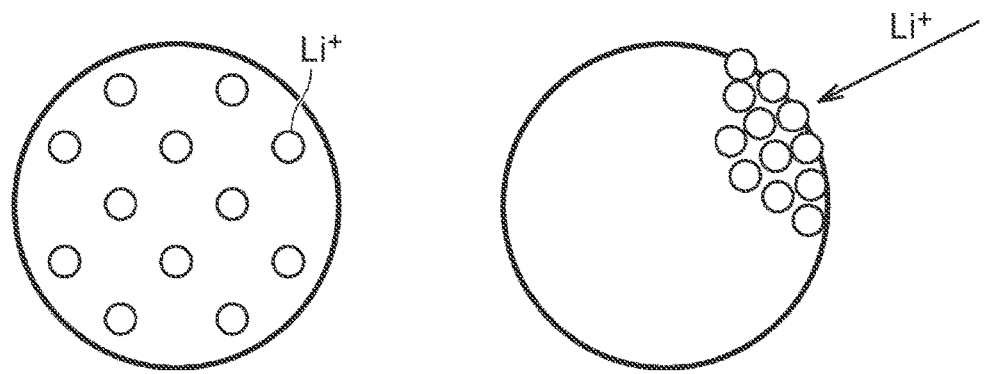
FIG. 4 is a diagram for explaining the distribution of lithium ions in the positive electrode active material.

FIG. 4 is a diagram for explaining the distribution of lithium ions in the positive electrode active material. When the battery 21 is in the no-load state, the lithium ions are uniformly distributed in the positive electrode active material. On the other hand, when the battery 21 is discharged, lithium ions are inserted into the positive electrode active material from a specific direction (a direction from the negative electrode toward the positive electrode). Therefore, lithium ions are unevenly distributed in the positive electrode active material (polarization state). More specifically, the lithium ions become dense in a region near the insertion point of the lithium ions into the positive electrode active material. On the other hand, the lithium ions become sparse in the region away from the insertion point of the lithium ions into the positive electrode active material. In a region where lithium ions are dense, new lithium ions are hardly inserted into the positive electrode active material. As a result, the internal resistance R of the battery 21 increases. As a result, the voltage drop ($I_B \times R$) due to discharging of the battery 21 increases, so that the closed-circuit voltage of the battery 21 tends to decrease. Hereinafter, the closed voltage is referred to as "Closed Circuit Voltage (CCV)", and the open-circuit voltage is referred to as "Open Circuit Voltage (OCV)".

<OCV vs CCV>

Figure 5:
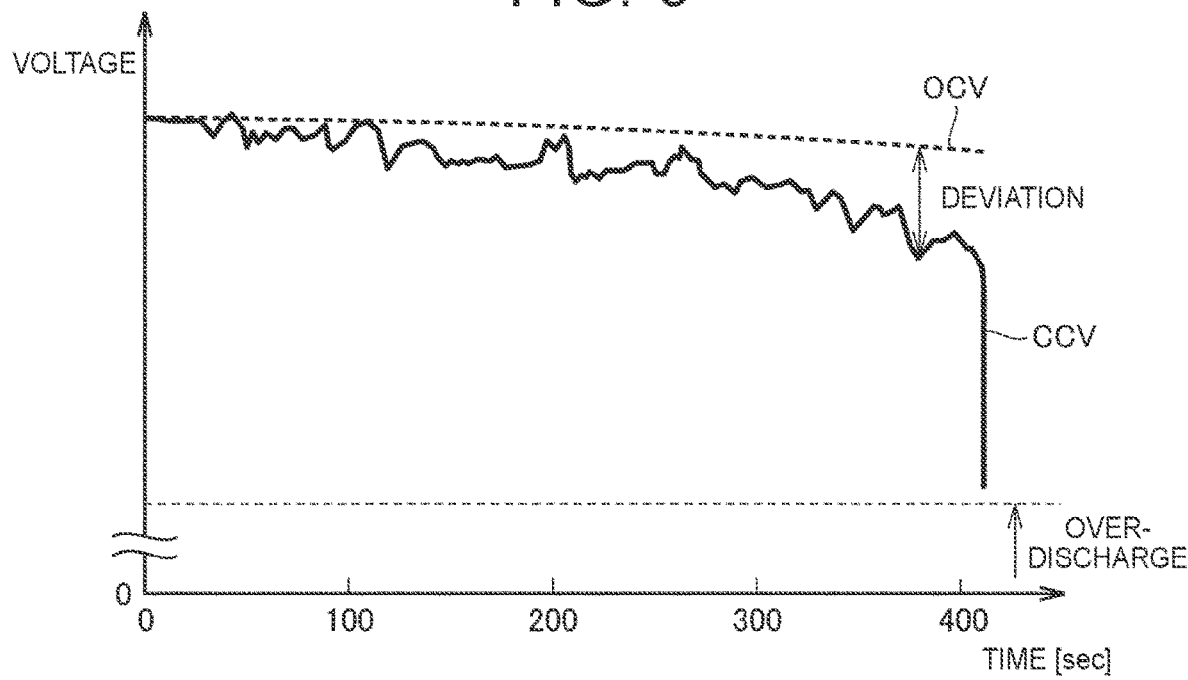
FIG. 5 is a diagram illustrating an example of a change in OCV and CCV of a battery during discharging.

FIG. 5 is a diagram illustrating an example of a change in OCV and CCV of the battery 21 during discharging. The horizontal axis represents the elapsed time from the start of discharge. The vertical axis represents voltage.

The OCV of the battery 21 monotonically decreases as the discharge proceeds. On the other hand, the CCV of the battery 21 may vary depending on the discharge current. As the uneven distribution of lithium ions progresses, the internal resistance R increases and the amount of voltage drop increases. The CCV then deviates from the OCV. When the CCV falls below a lower limit voltage determined in accordance with characteristics of the negative electrode material or the like, the battery 21 is brought into an over-discharge state. As a result, there is a possibility that copper ions are eluted from the copper foil of the negative electrode current collector or the SEI film is decomposed.

Therefore, in the present embodiment, the voltage drop amount is examined in detail for each impedance component of the internal resistance R of the battery 21. By doing so, as described below, it is possible to accurately calculate the voltage drop amount associated with the polarization of the battery 21.

<Impedance Component of Internal Resistance>

Figure 6:
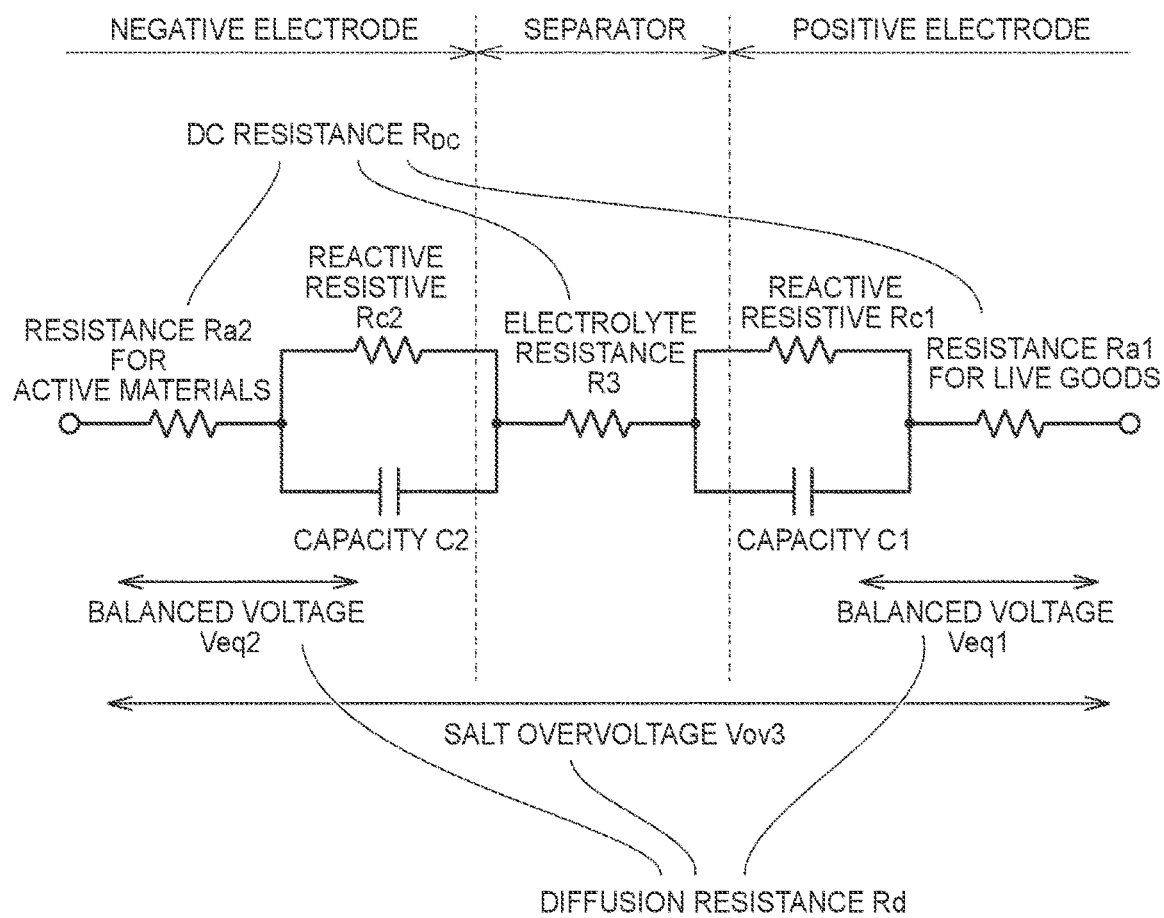
FIG. 6 is a diagram for explaining a resistance component of an internal resistance of a battery.

FIG. 6 is a diagram for explaining an impedance component of an internal resistance of the battery 21. FIG. 6 shows an example of an equivalent circuit diagram of a positive electrode, a negative electrode, and a separator of the battery 21 (each cell 211). The impedance components of the battery 21 can be classified into DC resistances $R_{DC}$, reactive resistances Rc, and diffusion resistances Rd.

The DC resistance $R_{DC}$ is an impedance-component associated with the transfer of lithium-ions and electrons between the positive and negative electrodes. The DC resistance $R_{DC}$ is increased due to a deviation such as a salt concentration distribution of the electrolyte solution when a high load is applied to the battery 21 (when a high voltage is applied or a large current flows). The DC resistance $R_{DC}$ is represented in the equivalent circuit diagram as the active material resistance Ra1 of the positive electrode, the active material resistance Ra2 of the negative electrode, and the electrolyte resistance R3 of the separator.

The reactive resistance Rc is an impedance component related to transfer of charge (charge transfer) at the interface between the electrolyte and the active material interface (the surfaces of the positive electrode active material and the negative electrode active material). The reactive resistance Rc increases due to, for example, growth of a coating film at an active material/electrolyte interface when the battery 21 in a high SOC state is in a high-temperature environment. In the equivalent circuit diagram, the reactive resistance Rc is represented as a resistance component Rc1 of the positive electrode and a resistance component Rc2 of the negative electrode.

The diffusion resistance Rd is an impedance component related to diffusion of a salt in an electrolytic solution or a charge transport material in an active material. The diffusion resistance Rd increases due to cracking of the active material when a high load is applied. The diffusion resistance Rd is determined from the balanced voltage Veq1 generated in the positive electrode, the balanced voltage Veq2 generated in the negative electrode, and the salt concentration overvoltage Vov3 generated in the cell (the overvoltage caused by the salt concentration distribution of the active material occurring in the separators).

In FIG. 6, each impedance component is divided into a positive electrode side and a negative electrode side. However, in this embodiment, the positive electrode side and the negative electrode side are not particularly distinguished from each other. That is, an impedance component in which the impedance component on the positive electrode side and the impedance component on the negative electrode side are integrated is used.

Figure 7:
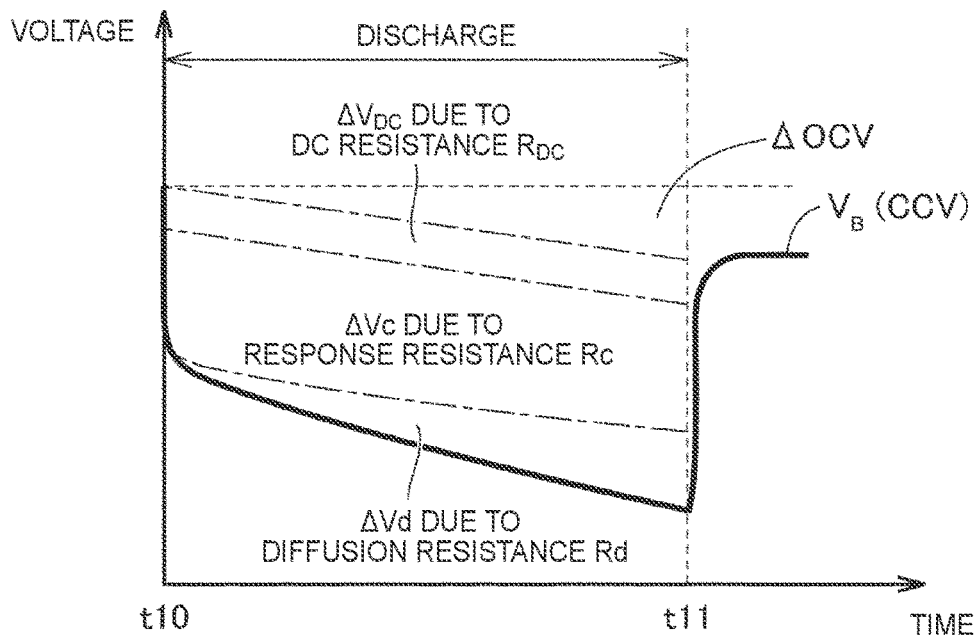
FIG. 7 is a diagram for explaining a voltage drop of a battery.

FIG. 7 is a diagram for explaining a voltage drop of the battery 21. The horizontal axis represents the elapsed time from the start of discharge. The vertical axis represents voltage. The same applies to FIG. 8 described later.

In this example, the battery 21 is discharged continuously with a large current of several hundred amperes (A) in a period from the time t10 to the time t11 (for example, several minutes to several tens of minutes). As illustrated in FIG. 7, the voltage drop amount during the discharging period can be classified into an OCV drop amount $\Delta$OCV, a voltage drop amount $\Delta V_{DC}$ caused by the DC resistance $R_{DC}$, a voltage drop amount $\Delta$Vc caused by the reactive resistance Rc, and a voltage drop amount $\Delta$Vd caused by the diffusion resistance Rd. The voltage drop amount during discharging is the sum of the OCV drop amount, the voltage drop amount $\Delta V_{DC}$, $\Delta$Vc, $\Delta$Vd caused by the three impedance components. In the following description, $\Delta$OCV, $\Delta V_{DC}$, and $\Delta$Vc and $\Delta$Vd are both positive values.

Figure 8:
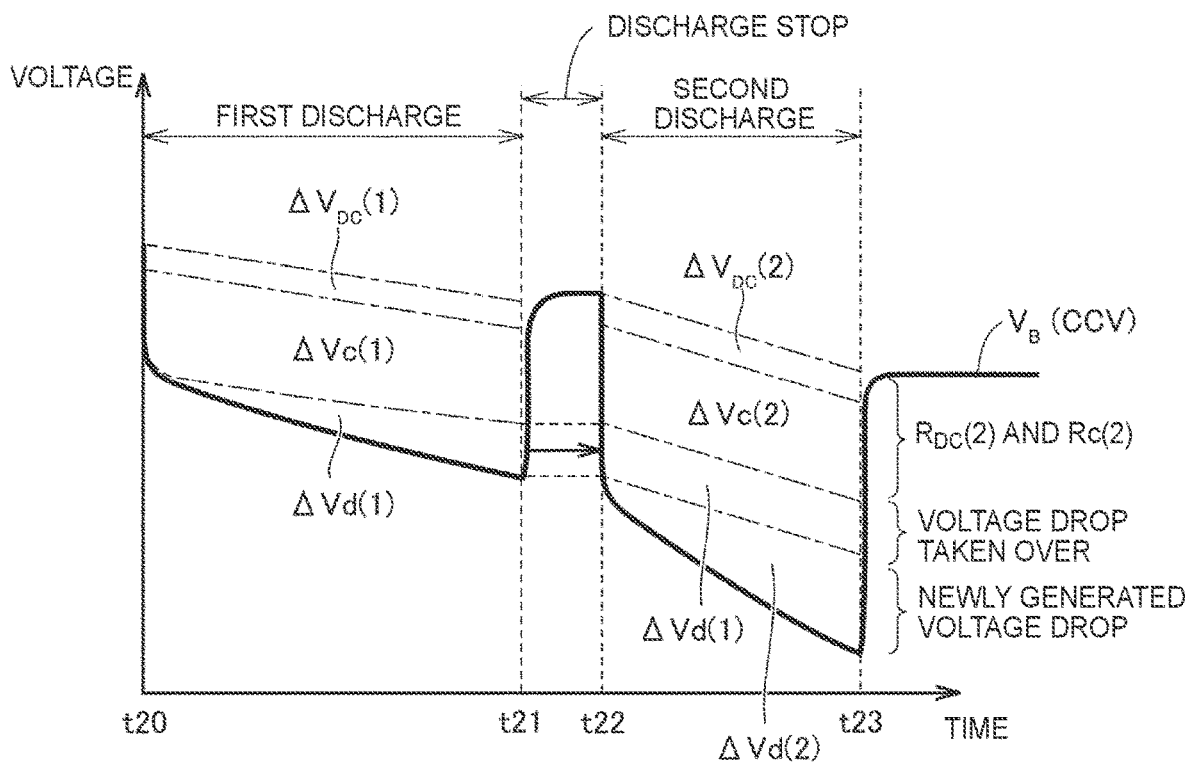
FIG. 8 is a diagram for explaining a voltage drop of a battery when the battery is intermittently discharged.

FIG. 8 is a diagram for explaining a voltage drop of the battery 21 when the battery 21 is intermittently discharged. In FIG. 8, the battery 21 is discharged with a large current during a period from the time t20 to the time t21. This discharge is referred to as "first discharge". During a period from the subsequent time t21 to the time t22 (for example, several tens of seconds to several minutes), the discharge is stopped. Thereafter, in a period from time t22 to time t23, the battery 21 is discharged again with a large current. This discharge is referred to as "second discharge". The index (1) of the parameter indicates that the parameter relates to the first discharge. The parameter index (2) indicates that the parameter relates to the second discharge.

The voltage drop amount accompanying the first discharge is the sum of the OCV drop amount $\Delta$OCV(1), the voltage drop amount $\Delta V_{DC}$(1) caused by the DC resistance $R_{DC}$, the voltage drop amount $\Delta$Vc(1) caused by the reactive resistance Rc, and the voltage drop amount $\Delta$Vd(1) caused by the diffusion resistance Rd, as described in FIG. 7. On the other hand, the voltage drop amount due to the second discharge is the sum of the OCV drop amount $\Delta$OCV(2), the voltage drop amount $\Delta V_{DC}$(2) due to the DC resistance $R_{DC}$, the voltage drop amount $\Delta$Vc(2) due to the reactive resistance Rc, and the voltage drop amount due to the diffusion resistance Rd.

According to the findings obtained by the present inventors, when the discharge stop period between the first discharge and the second discharge is relatively short, the voltage drop amount $\Delta$Vd(1) caused by the diffusion resistance Rd generated in association with the first discharge is also taken over by the second discharge. In other words, the voltage drop amount $\Delta$Vd(1) caused by the diffusion resistance Rd is accumulated. Therefore, the voltage drop amount caused by the diffusion resistance Rd in the second discharge is the sum of the voltage drop amount $\Delta$Vd(1) caused by the diffusion resistance Rd taken over from the first discharge and the voltage drop amount $\Delta$Vd(2) caused by the diffusion resistance Rd newly generated in the second discharge.

The voltage drop amount ($\Delta$Vd(1)+$\Delta$Vd(2)) caused by the diffusion resistance Rd at the time of the second discharge reflects the polarization level (the degree of generation/elimination of polarization) in the battery 21, that is, the degree of polarization generated in accordance with the first discharge, the degree of polarization relaxed in accordance with the discharge stop between the first discharge and the second discharge, and the degree of polarization generated in accordance with the second discharge. Therefore, the amount of voltage drop caused by the diffusion resistance Rd is hereinafter referred to as "polarization overvoltage $\Delta$Vp". The polarization overvoltage $\Delta$Vp can be indirectly calculated using a voltage drop amount caused by another impedance component, as described below.

Figure 9:
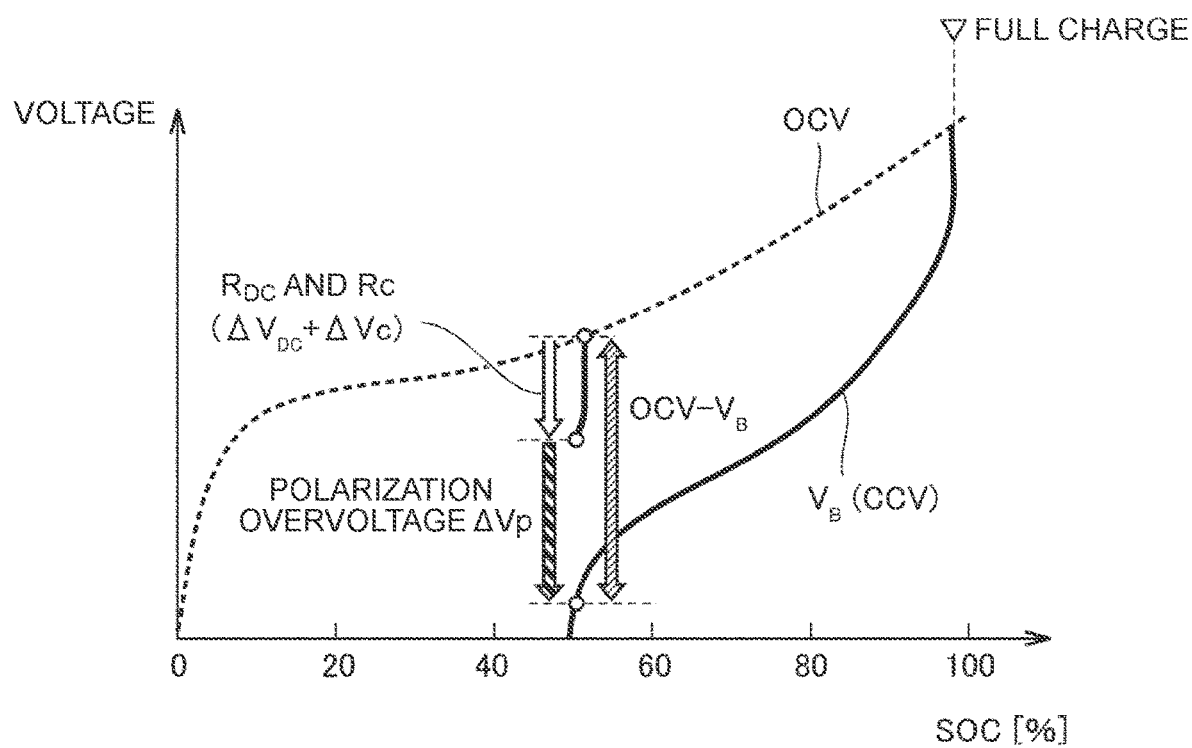
FIG. 9 is a diagram for explaining an outline of a method of calculating a polarization overvoltage.

FIG. 9 is a diagram for explaining an outline of a calculation method of the polarization overvoltage Vp. The horizontal axis represents the SOC of the battery 21. The vertical axis represents voltage. In FIG. 9, OCV-SOC curve is indicated by a broken line, and CCV-SOC curve is indicated by a solid line when the battery 21 is discharged from a state close to a state of being fully charged.

Here, a situation in which the battery 21 having the SOC of 50% is discharged will be described as an example. The voltage differential between OCV and CCV (OCV−$V_B$) is the sum of the voltage drop caused by the DC resistance $R_{DC}$ and the reactive resistance Rc ($\Delta V_{DC}$+$\Delta$Vc) and the polarization overvoltage $\Delta$Vp. Therefore, the polarization overvoltage Vp is calculated by returning (subtracting) the current drop ($\Delta V_{DC}$+$\Delta$Vc) caused by the DC resistance $R_{DC}$ and the reactive resistance Rc from the voltage difference (OCV−$V_B$) between the OCV and the CCV (see Equation (1) below).

$$\Delta Vp = (OCV - V_B) - (\Delta V_{DC} + \Delta Vc) \quad (1)$$

The OCV can be calculated based on the SOC at the start of discharge of the battery 21 and the integrated value $\Delta$Ah of the discharge current (details will be described later). In addition, CCVs (=$V_B$) are acquired from the voltage sensor 221 at appropriate times. Therefore, the voltage-difference (OCV−$V_B$) between the OCV and the CCV can be calculated. Further, the voltage drop amounts ($\Delta V_{DC}$+$\Delta$Vc) caused by the DC resistance $R_{DC}$ and the reactive resistance Rc can also be calculated using a map MP1 (see FIG. 11) described later. Therefore, the polarization overvoltage $\Delta$Vp can be calculated according to the above equation (1).

<Process Flow>

Figure 10:
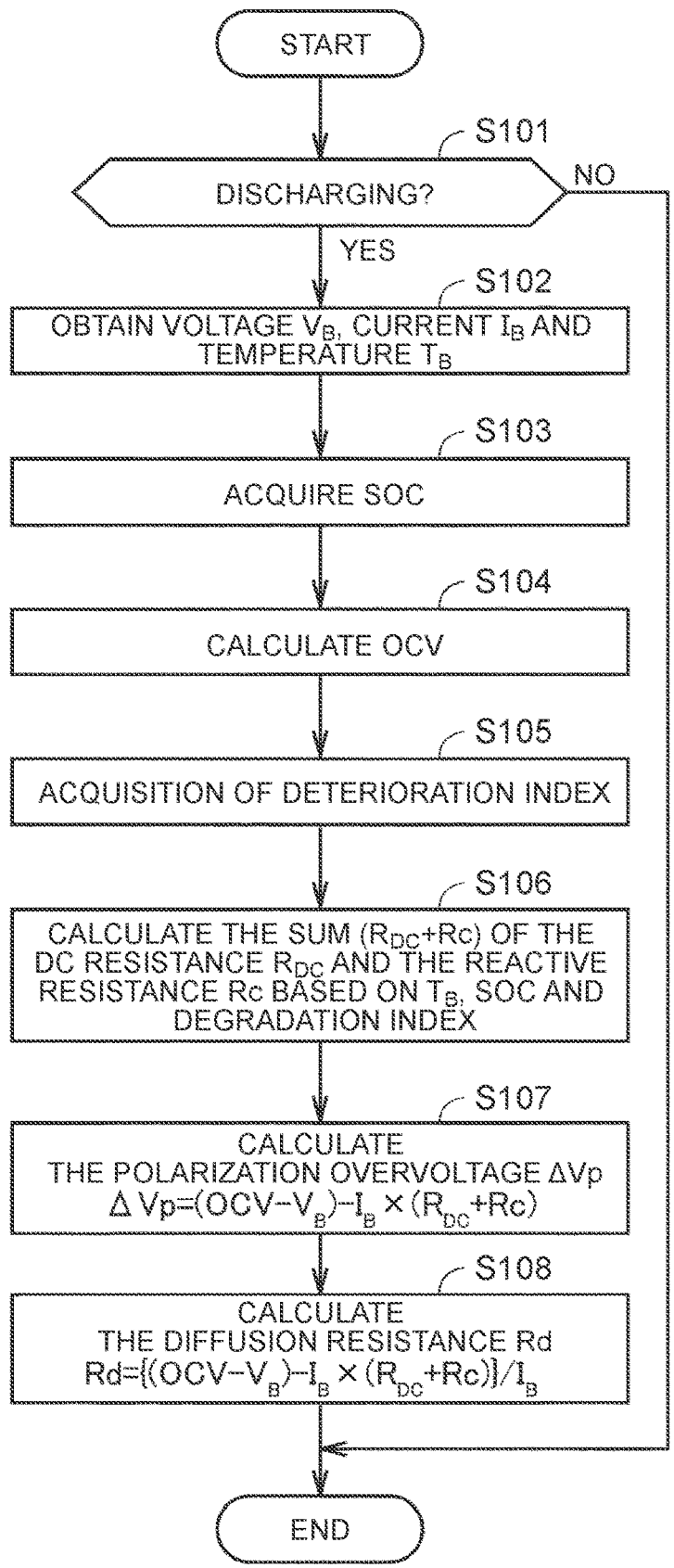
FIG. 10 is a flowchart illustrating a processing procedure of a polarization overvoltage calculation process according to Embodiment 1.

FIG. 10 is a flowchart illustrating a processing procedure of a calculation process of the polarization overvoltage $\Delta$Vp according to the first embodiment. This flowchart is executed when a predetermined condition is satisfied (for example, every predetermined cycle). The steps are implemented by software-processing by a battery ECU 24 (processor 241), but may also be implemented by hardware (electric circuitry) disposed in a battery ECU 24. Hereinafter, the term "step" is abbreviated as S. The same applies to other flowcharts described later.

In S101, the battery ECU 24 determines whether the battery 21 is discharging. While the battery is being charged (NO in S101), another flow (not shown) for charging is executed. When the battery 21 is discharging (YES in S101), the battery ECU 24 acquires the voltage $V_B$ from the voltage sensor 221, acquires the current $I_B$ from the current sensor 222, and acquires the temperature $T_B$ from the temperature sensor 223 (S102).

In S103, the battery ECU 24 acquires the SOCs of the battery 21 calculated in accordance with another flow chart (not shown). More specifically, the cell ECU 24 performs the following process. When the battery 21 is not charged or discharged and a certain period of time (for example, several tens of minutes) elapses, the polarization is sufficiently relaxed (i.e., eliminated). The battery ECU 24 calculates the SOC (initial SOC) of the battery 21 from the OCV by referring to OCV-SOC curve stored in advance in the memory 242 with the detected value of the voltage sensor 221 in the depolarized state as the OCV. The full charge capacity of the battery 21 is known. Therefore, the battery ECU 24 can calculate the capacity (Ah) of the battery 21 in the depolarized state from the initial-SOC and the full-charge capacity. During the subsequent discharge of the battery 21, the battery ECU 24 integrates the discharge current from the depolarized state (the time point at which the initial-SOC is calculated). The battery ECU 24 can calculate the current capacity of the battery 21 by subtracting the integrated value ΔAh of the discharging current from the capacity in the depolarized state. Further, the battery ECU 24 can calculate the SOCs of the battery 21 at the present time from the ratio of the current capacity to the full charge capacity.

In S104, the cell ECU 24 calculates the OCVs of the current battery 21. The cell ECU 24 can calculate the OCV from the current SOC acquired by S103 by referring to OCV-SOC curve.

In S105, the cell ECU 24 calculates a "deterioration index" which is an index indicating the degree of progress of deterioration of the battery 21. In this example, the deterioration index is the number of years elapsed since the time of manufacture of the battery 21. However, the deterioration index is not limited to this, and may be the total travel distance of the vehicle 1. The deterioration index may be a value determined according to both the number of years elapsed since the time of manufacture of the battery 21 and the total travel distance of the vehicle 1.

In S106, the battery ECU 24 calculates the sum ($R_{DC}+R_c$) of the DC resistance $R_{DC}$ of the battery 21 and the reactive resistance Rc based on the temperature $T_B$, the SOC, and the degradation index of the battery 21. The following map MP1 can be used to calculate the sum ($R_{DC}+Rc$). Note that a table, a function, or a conversion formula may be used instead of the map. The same applies to other map MP2,MP3 (see FIGS. 16 and 17) shown later.

Figure 11:
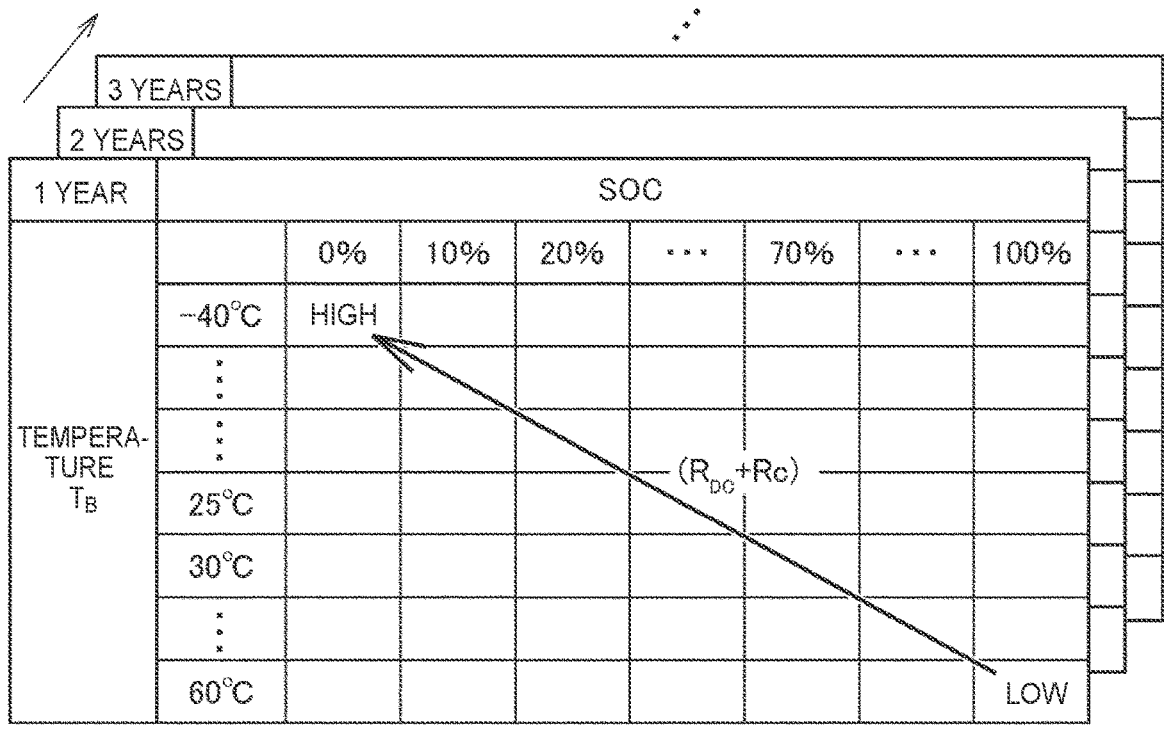
FIG. 11 is a conceptual diagram of a map used for calculating a sum of a DC resistance and a reactive resistance.

FIG. 11 is a conceptual diagram of a map MP1 used for calculating a sum ($R_{DC}+Rc$) of a DC resistance $R_{DC}$ and a reactive resistance Rc. As shown in FIG. 11, the map MP1 has a data format in which the correlation between the temperature $T_B$ and the SOC and the above sum ($R_{DC}+Rc$) is defined for each degradation index (e.g., one year after manufacture of the battery 21, two years, three years, etc.). Typically, the lower the SOCs and the lower the $T_B$, the higher the sum of the DC resistance $R_{DC}$ and the reactive resistance Rc ($R_{DC}+Rc$). Note that the map MP1 corresponds to a "correlation" according to the present disclosure.

A method of creating a map MP1 will be described. A plurality of batteries (batteries of the same type as the battery 21) having different deterioration indices are prepared. Then, for each of the plurality of batteries, a voltage response after a predetermined time when a current is applied to the battery is measured. The current response at the time of voltage application may be measured. The impedance is calculated from the ratio between the voltage and the current.

Figure 12:
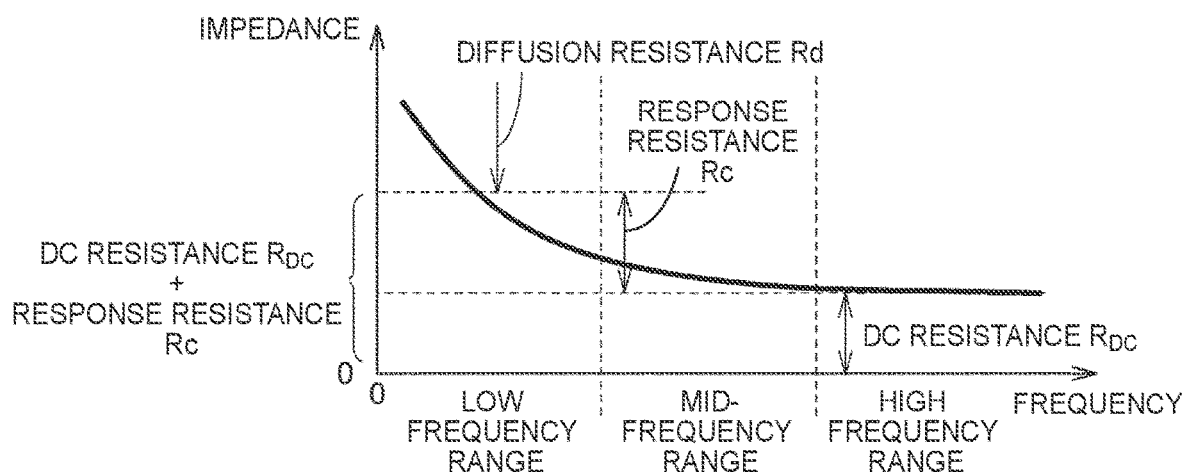
FIG. 12 is a diagram for explaining responsiveness of impedance of a battery.

FIG. 12 is a diagram for explaining responsiveness of impedance of a battery. In this example, an alternating current is applied to the battery. The horizontal axis represents the frequency of the alternating current applied to the battery. The vertical axis represents the impedance of the battery.

As described in FIG. 6, the internal resistance of the battery includes various impedance components. For each impedance component, a time (response time) required for a response to an applied current is different. The impedance component having a relatively short response time can also follow changes in the alternating current at high frequencies. On the other hand, an impedance component having a relatively long response time cannot follow a change in an alternating current at a high frequency. Therefore, when the frequency range is divided into a low frequency range, a middle frequency range, and a high frequency range, the dominant impedance component can be divided in each frequency range.

For example, in the frequency range of 10 mHz to 100 kHz, a frequency range of 5 Hz or more and 100 kHz or less (a response time of 10 microseconds or more and less than 0.2 seconds) is referred to as a "high frequency range". A frequency range of 1 Hz or more and 5 Hz or less (response time 0.2 seconds or more and less than 1 second) is referred to as a "medium frequency range". A frequency range of more than 10 mHz and 1 Hz or less (response time of 1 second or more and less than 100 seconds) is referred to as a "low frequency range".

The impedance components measured when the frequency of the alternating current is in the high frequency range mainly include a DC resistance $R_{DC}$ of the battery. The impedance components measured when the frequency of the alternating current is in the mid-frequency range mainly include a DC resistance $R_{DC}$ and a reactive resistance Rc. The impedance components measured when the frequency of the alternating current is within the low frequency range include both the DC resistance $R_{DC}$, the response resistance Rc, and the diffusion resistance Rd. Therefore, the sum of the DC resistance $R_{DC}$ and the reactive resistance Rc ($R_{DC}+Rc$) can be obtained from the measured impedance of the battery in the mid-frequency range. This is because the response time (0.2 seconds or more and less than 1 second) in the mid-frequency range is longer than the time when the DC resistance $R_{DC}$ and the reactive resistance Rc of the battery can follow the change in the AC current, and the diffusion resistance Rd of the battery is shorter than the time when the diffusion resistance Rd of the battery can follow the change in the AC current.

Map MP1 can be created by performing impedance-measurements under various combinations of temperature-SOC conditions for each battery with differing degradation indices. By referring to the map MP1, it is possible to calculate the sum ($R_{DC}+Rc$) of the DC resistance $R_{DC}$ of the battery 21 and the reactive resistance Rc from the temperature $T_B$ of the battery 21, the SOC, and the degradation index.

In some embodiments, the degradation index is not a parameter for the map MP1. However, since the map MP1 includes the deterioration index, the degree of progress of the deterioration of the battery 21 (increased resistance due to deterioration) is reflected in the sum ($R_{DC}+Rc$), so that it is possible to improve the calculation accuracy of the sum ($R_{DC}+Rc$).

Referring back to FIG. 10, in S107, the battery ECU 24 calculates the polarization overvoltage ΔVp of the battery 21 based on the voltage difference between the OCV and the CCV (OCV−$V_B$), the current $I_B$, and the sum of the DC resistance $R_{DC}$ and the reactive resistance Rc ($R_{DC}+Rc$). Equation (1) is described again below. Here, $\Delta V_{DC}+\Delta Vc=I_B(R_{DC}+Rc)$ is substituted.

$$\Delta Vp = (OCV - V_B) - I_B \times (R_{DC}+Rc) \qquad (1)$$

In S108, the cell ECU 24 calculates the diffusion resistance Rd based on the polarization overvoltage ΔVp. The diffusion resistance Rd can be calculated by dividing the polarization overvoltage ΔVp by the current $I_B$ ($Rd=ΔVp/I_B$) (see Equation (2) below).

$$Rd=\{(OCV-V_B)-I_B \times (R_{DC} \pm Rc)\}/I_B \qquad (2)$$

Since the polarization overvoltage Vp and the diffuse resistance Rd are connected by the Ohmic law ($Rd=ΔVp/I_B$), the detected value ($I_B$) of the current sensor 222 can be easily converted from one to the other. The calculation of the polarization overvoltage Vp corresponds to displaying the polarization level (the degree of generation/elimination of polarization) of the battery 21 as a voltage. The calculation of the diffusion resistance Rd corresponds to displaying the polarization level of the battery 21 as a resistance. Therefore, the "calculation of the polarization overvoltage" in the present disclosure is not limited to the configuration in which the polarization overvoltage ΔVp is calculated according to Equation (1), but also includes a configuration in which the diffusion resistance Rd is calculated according to Equation (2).

Comparison with JP 2013-221790 A

In JP 2013-221790 A, the internal resistance is divided into a DC resistance component and a polarization resistance component (see paragraphs [0042] to [0044] of JP 2013-221790 A). In this case, the polarization resistance component is considered to include both the reactive resistance component and the diffusion resistance component. However, the voltage drop caused by the DC resistance and the voltage drop caused by the reactive resistance are always generated while the discharge current is flowing, regardless of whether the polarization is generated or eliminated. That is, in the disclosure disclosed in JP 2013-221790 A, there is room for improvement in the calculation accuracy of the voltage drop amount due to polarization by an amount including the voltage drop amount caused by the reactive resistance irrelevant to polarization.

More specifically, the reactive resistance Rc is more temperature-dependent than the DC resistance $R_{DC}$. DC resistance $R_{DC}$ does not increase much under normal temperature conditions and under low temperature conditions, whereas reactive resistance Rc increases significantly under normal temperature conditions compared to under low temperature conditions. In addition, the reactive resistance Rc tends to increase over time by an amount that is more susceptible to thermal changes than the DC resistance $R_{DC}$ (so-called aging degradation). Therefore, when the polarization resistance component is included in the reactive resistance component as in JP 2013-221790 A, errors due to temperature change and/or aging deterioration are likely to occur.

On the other hand, in the first embodiment, the polarization overvoltage Vp is calculated by subtracting the voltage drop ($ΔV_{DC}+ΔVc$) caused by the DC resistance $R_{DC}$ and the response resistance Rc from the voltage difference ($OCV-V_B$) between the OCV and the CCV. The polarization overvoltage ΔVp does not include not only the voltage drop amount ΔVc caused by the DC resistance $R_{DC}$ but also the voltage drop amount ΔVc caused by the response resistance Rc. In other words, the voltage drop amount ΔVc caused by the reactive resistance Rc is excluded from the polarization overvoltage ΔVp. As a result, only the voltage drop amount caused by the diffusion resistance Rd is reflected in the polarization overvoltage ΔVp. Therefore, according to the first embodiment, it is possible to accurately calculate the amount of voltage drop due to polarization during discharge of the battery 21.

Second Embodiment

In the second embodiment, a configuration will be described in which the discharge power of the battery 21 is suppressed in accordance with the polarization level of the battery 21, in other words, the degree of uneven distribution of lithium ions in the positive electrode active material. The overall configuration of the vehicle on which the battery system according to the second embodiment is mounted is the same as the overall configuration of the vehicle 1 on which the battery pack 2 according to the first embodiment is mounted (see FIG. 1).

Figure 13:
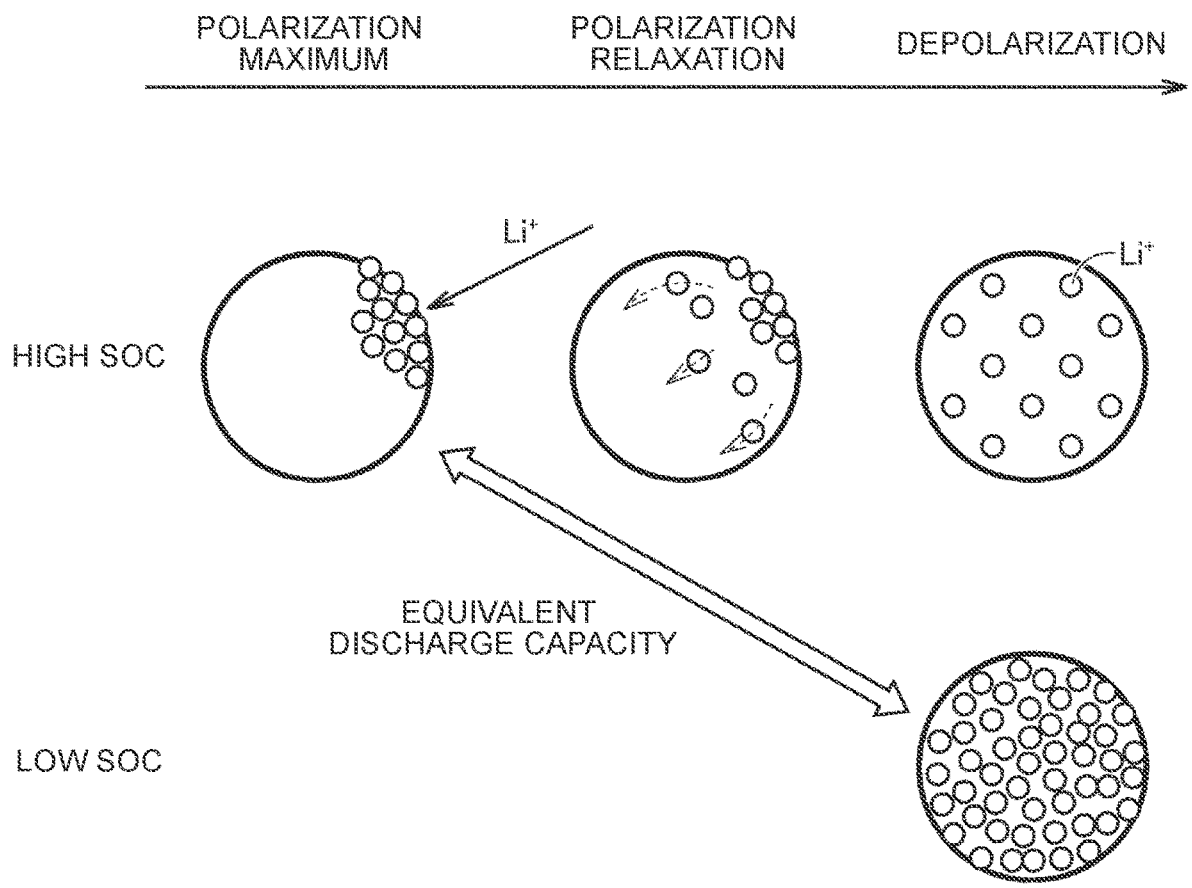
FIG. 13 is a diagram for explaining uneven distribution of lithium ions in a positive electrode active material.

FIG. 13 is a diagram for explaining uneven distribution of lithium ions in the positive electrode active material. As described in FIG. 4, when the battery 21 is discharged at a large current, lithium ions are unevenly distributed in the positive electrode active material (polarization state). When the discharge is stopped, the diffusion of lithium ions in the positive electrode active material proceeds, and the polarization is relaxed. When a certain period of time elapses, the distribution of lithium ions in the positive electrode active material becomes uniform, and the polarization is eliminated (unloaded state).

In FIG. 13, the SOC is represented by the number of white circles representing lithium ions. When the SOC is high, the total amount of lithium ions (the number of circles) is smaller than when the SOC is low. However, even when the SOC is high, lithium ions are locally present in a region where lithium ions are dense (see the upper left), which is similar to the case where the SOC is low and lithium ions are uniformly distributed (see the lower right). That is, the region in which the lithium ions are unevenly distributed even in the high SOC includes the lithium ions having the same density as the region in which the lithium ions are uniformly distributed in the low SOC. Therefore, when these two regions are compared, the amount of lithium ions that can be newly received (inserted) is also comparable. This means that the discharge capacity of the battery 21 (electric power dischargeable from the battery 21) is equivalent between the high SOC and the polarization state and the low SOC and the no-load state.

Therefore, in the second embodiment, the SOC in the polarization state is represented by the SOC in the unloaded state in which the discharging capability is the same. Whether lithium ions can be newly accepted depends on the amount of lithium ions present on the surface of the active material. Therefore, in the following, the SOC in the polarization state is also referred to as "surface SOC".

Figure 14:
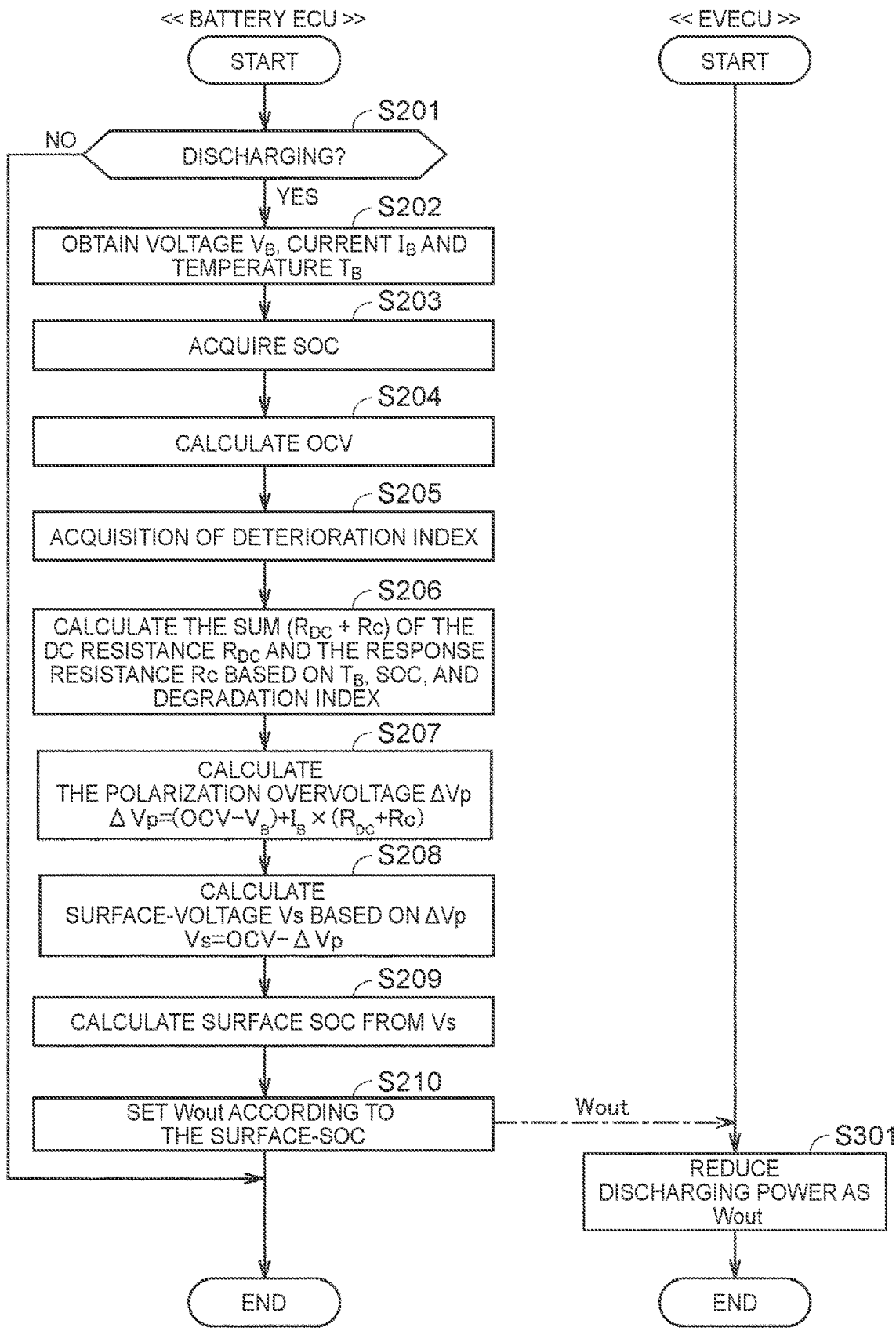
FIG. 14 is a flowchart illustrating a processing procedure of discharge power suppression processing in Embodiment 2.

FIG. 14 is a flowchart illustrating a processing procedure of discharge power suppression processing according to Embodiment 2. A series of processes executed by the battery ECU 24 is shown on the left, and a series of processes executed by EV ECU 6 is shown on the right. The same applies to the flowchart of FIG. 18 described later. S201 to S207 process is the same as S101 to S107 process (see FIG. 10) in Embodiment 1, and therefore will not be described again.

In S208, the cell ECU 24 calculates the "surface voltage Vs" defined by using the polarization overvoltage ΔVp calculated by S207. The surface voltage Vs is a voltage obtained by subtracting the polarization overvoltage ΔVp from the OCV as shown in the following equation (3). In the unloaded state, since the polarization overvoltage ΔVp=0, the surface voltage Vs coincides with the OCV. As the polarization overvoltage ΔVp increases, the deviation of the surface voltage Vs from the OCV proceeds. That is, as the polarization proceeds, the surface voltage Vs decreases.

$$Vs=OCV-\Delta Vp \qquad (3)$$

In S209, the cell ECU 24 calculates the surface SOCs based on the surface voltages Vs. A method of calculating the surface SOC will be described below. In order to distinguish it from the surface SOC, the commonly used SOC (SOC determined according to the total amount of lithium ions in the positive electrode active material) is also referred to as "actual SOC".

Figure 15:
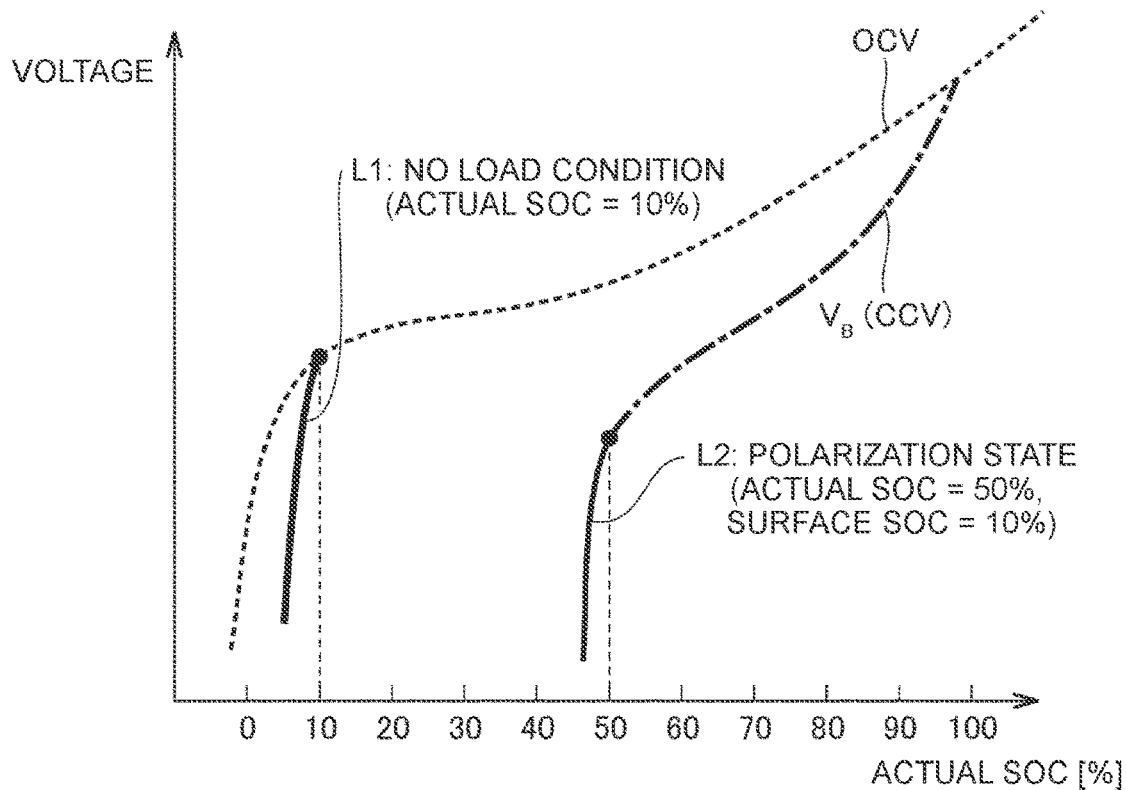
FIG. 15 is a diagram for explaining the relationship between the actual SOC and the surface SOC.

FIG. 15 is a diagram for explaining the relationship between the actual SOC and the surface SOC. The horizontal axis represents actual SOC. The vertical axis represents voltage. Two curve L1,L2 are shown in FIG. 15.

Curve L1 is a OCV-SOC curve indicating the OCV-change when battery 21 in the no-load condition is discharged from actual SOC=10% with a predetermined discharging current. Curve L2 is a CCV-SOC curve showing the change in CCVs when the polarized battery 21 is discharged from the actual SOC=50% with a discharging current equal to that described above.

It can be seen from FIG. 15 that the rate of change of the curve L1 and the rate of change of the curve L2 are approximately equal. The rate of change is the amount of voltage drop per unit SOC corresponding to the slope of the tangent line (not shown). The rate of change is approximately equal because the polarization overvoltage $\Delta Vp$ is approximately equal between curve L1 and curve L2.

This means that, from the viewpoint of the discharging capability of the battery 21 (electric power dischargeable from the battery 21), the actual SOC=50% in the polarization state is equivalent to the actual SOC=10% in the no-load state. In other words, in the polarized state, even if the actual SOC is 50%, the battery 21 can be discharged only at a level equivalent to the actual SOC in the unloaded state of 10%. Therefore, in the second embodiment, when the actual SOC is 50%, the discharge power from the battery 21 is suppressed as if the actual SOC is 10%.

In this way, the surface SOC is introduced in order to suppress the discharge power. The surface SOC is a parameter representing the SOC in the polarization state of the battery 21 by the SOC in the unloaded state in which the discharging capability is equivalent. The surface SOC is calculated from the actual SOC by using the "shift amount $\Delta SOC$" as shown in the following Expression (4).

$$\text{Surface SOC} = \text{actual SOC} - \Delta SOC = \quad (4)$$

In the example illustrated in FIG. 15, the actual SOC is 50%, and the shift amount $\Delta SOC$ is calculated to be 40% from the surface voltage Vs at that time. In this case, surface SOC=50%−40%=10% is calculated.

Figure 16:
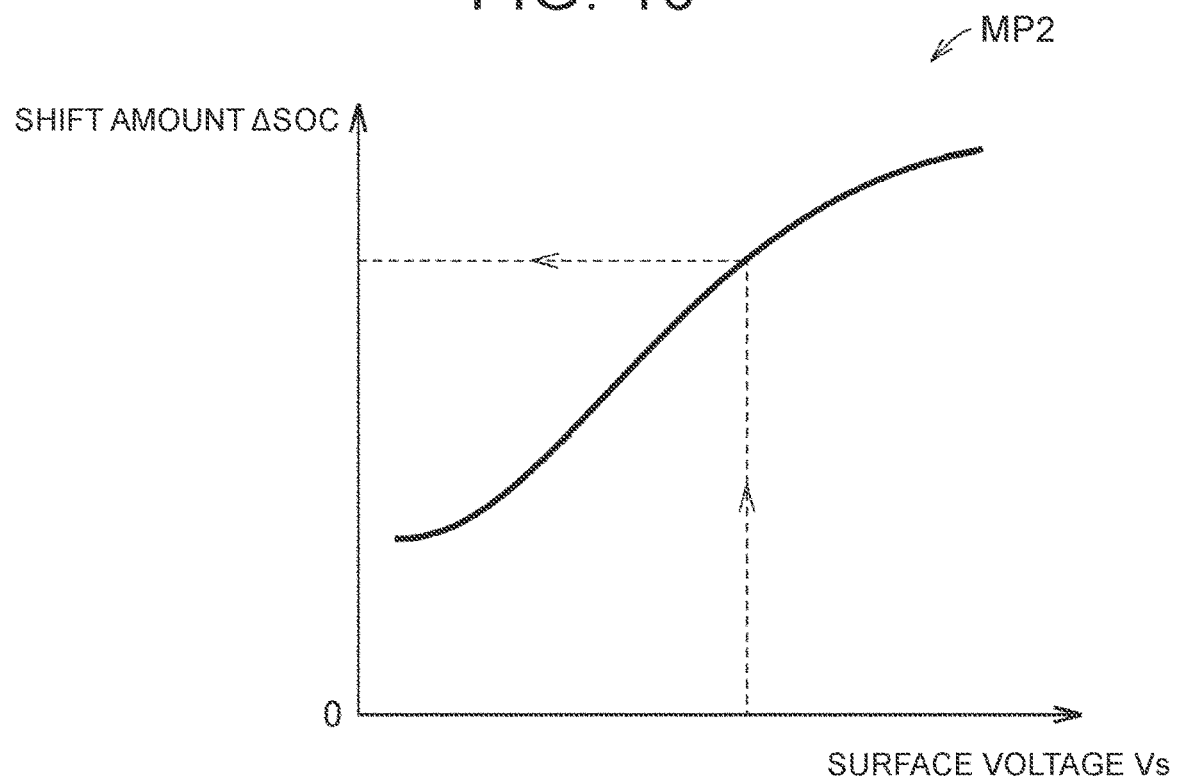
FIG. 16 is a diagram illustrating an example of a process of calculating a surface SOC from a surface voltage.

FIG. 16 is a diagram illustrating an example of a process of calculating the surface SOC from the surface voltage Vs. The horizontal axis represents the surface voltage Vs. The vertical axis represents the shift amount $\Delta SOC$. The relation between the surface-voltage Vs and the shift amount $\Delta SOC$ as shown in FIG. 16 is stored in the memory 242 of the battery ECU 24 as a map MP2, for example. The cell ECU 24 can calculate the shift amount $\Delta SOC$ from the surface-voltage Vs by referring to the map MP2.

The map MP2 is prepared based on previous experimentation. More specifically, as described in FIG. 15, when the rate of change of the curve L2 in the polarization state and the actual SOC=50% is equal to the rate of change of the curve L1 in the no-load state and the actual SOC=10%, the shift amount $\Delta SOC$=50%−10%=40%. The surface voltage Vs in the polarization state and at the actual SOC=50% is calculated according to the above equation (3). By carrying out the same preliminary experiment as in FIG. 15 under various thermal conditions, a combination of real SOC, polarized SOCs in unloaded conditions, in which the rates of change are equal to each other as in the curve L1,L2, is obtained. Thus, the map MP2 can be prepared.

Referring back to FIG. 14, in S210, the cell ECU 24 sets the upper-limit discharging power Wout according to the surface-SOC. The battery ECU 24 outputs the set upper limit discharging power Wout to EV ECU 6. EV ECU 6 suppresses the discharge power from the battery 21 in accordance with the upper limit discharge power Wout received from the battery ECU 24 (S301).

Figure 17:
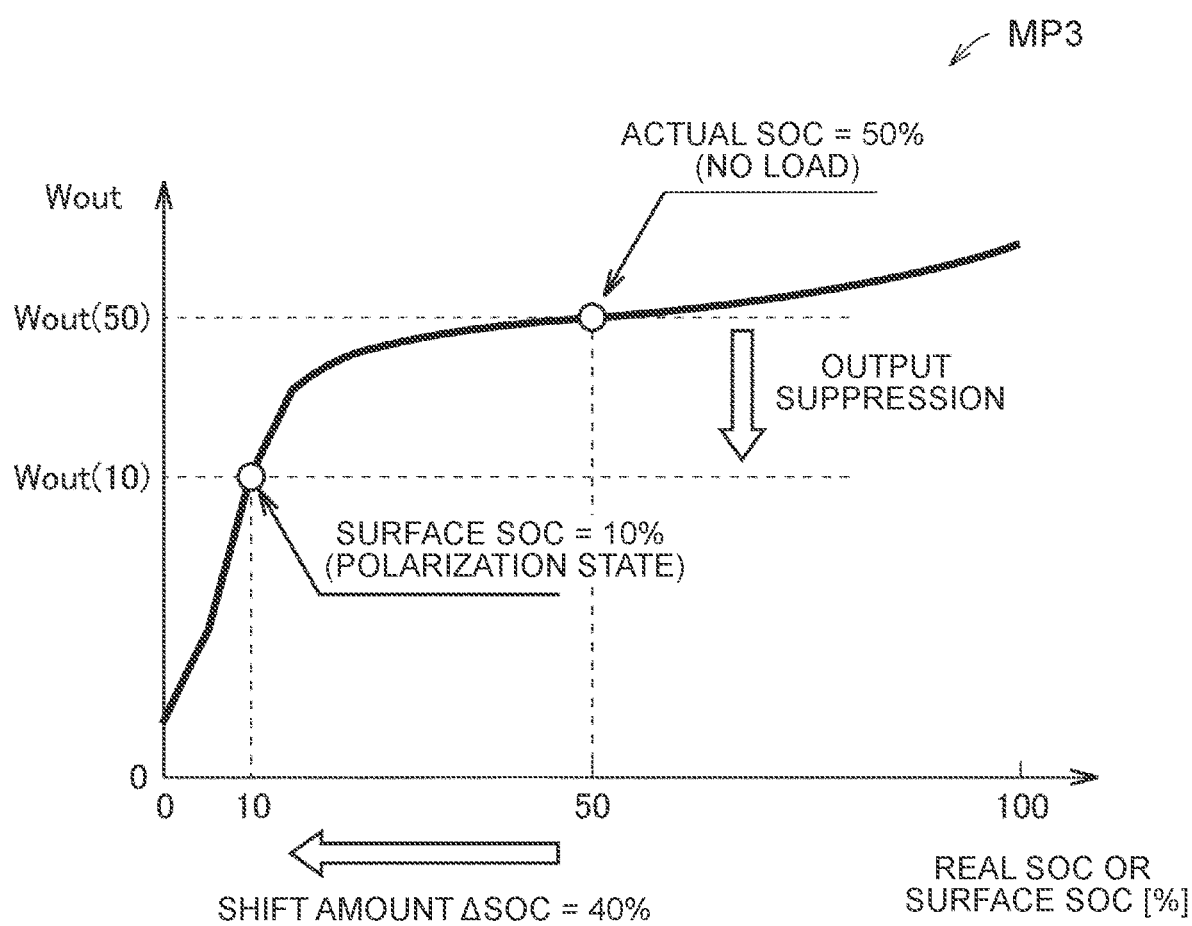
FIG. 17 is a diagram for explaining suppression of discharge power according to the surface SOC.

FIG. 17 is a diagram for explaining suppression of discharge power according to the surface SOC. The horizontal axis represents the actual SOC or surface SOC. The vertical axis represents the upper limit discharging power Wout. The relation between the upper limit discharging power Wout and the SOC (actual SOC or surface SOC) as shown in FIG. 17 is stored in the memories 242 of the cell ECU 24 as a map MP3, for example.

An example in which the actual SOC is 50% and the surface SOC is 10% will be described. When the battery 21 is in the unloaded state, the battery 21 is discharged within a range that does not exceed the upper limit discharge power Wout (50) corresponding to the actual SOC=50%. On the other hand, when the battery 21 is polarized, the battery ECU 24 uses the surface-SOC=10% instead of the actual SOC=50% when referring to the map MP3. Then, the battery 21 is discharged within a range that does not exceed the upper limit discharge power Wout (10) corresponding to the surface-SOC=10%.

As described above, if the cell ECU 24 reads the horizontal axis of the map MP3 as the actual SOC or the surface SOC, only one type of map MP3 needs to be prepared. That is, it is not necessary to prepare the map for the actual SOC and the map for the surface SOC separately. Therefore, the calculation process of the cell ECU 24 can be simplified.

As described above, in the second embodiment, the surface voltage Vs is calculated in accordance with the polarization overvoltage Vp (see Equation (3)). Further, the surface SOC is calculated from the shift amount $\Delta SOC$ corresponding to the surface voltage Vs (see FIG. 16). As described in detail with reference to FIG. 13, the surface SOC is determined in accordance with the local density of lithium ions in the portion where the deviation occurs when the deviation of lithium ions occurs in the positive electrode active material. On the other hand, the actual SOC is determined in accordance with the density of lithium ions in the case of being uniformly distributed in the positive electrode active material. In the present embodiment, the surface SOC in the polarization state and the actual SOC in the no-load state are associated with each other by the method described in FIGS. 15 and 16. Then, in the polarized state, the upper limit discharging power Wout is set in accordance with the surface SOC instead of the actual SOC (see FIG. 17). Therefore, according to the second embodiment, the discharge power can be suppressed according to the degree of occurrence of the actual polarization of the battery 21.

Third Embodiment

In the third embodiment, a configuration for displaying parameters related to the polarization level of the battery 21, such as the surface SOC of the battery 21 and the polarization overvoltage $\Delta Vp$, will be described. The overall configuration of the vehicle on which the battery system according to the third embodiment is mounted is the same as the overall configuration of the vehicle 1 on which the battery pack 2 according to the first embodiment is mounted (see FIG. 1).

Figure 18:
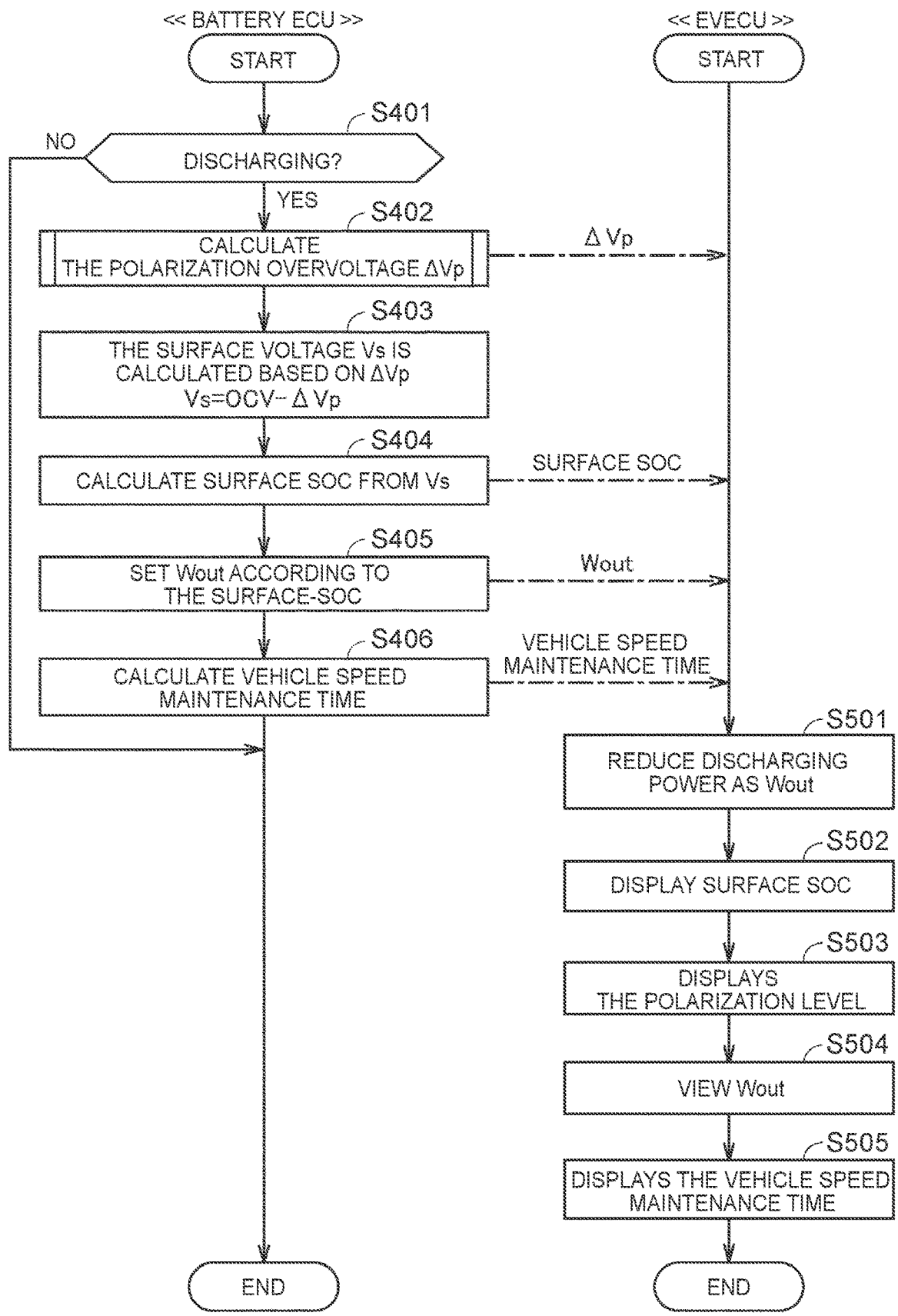
FIG. 18 is a flowchart illustrating a processing procedure of the display processing according to the third embodiment.

FIG. 18 is a flowchart illustrating a processing procedure of the display processing according to the third embodiment. Processing of S401 to S405 is the same as the processing (see FIG. 14) of S201 to S210 in Embodiment 2. However, in FIG. 18, the process of S202 to S207 in the second embodiment is typically illustrated by the process of S402 for convenience of the paper. The cell ECU 24 outputs the polarization overvoltage ΔVp calculated by S402 process to EV ECU 6. The cell ECU 24 outputs the surface-SOC calculated by S404 process to EV ECU 6. The cell ECU 24 outputs the upper limit discharging power Wout calculated by S405 process to EV ECU 6.

In S406, the battery ECU 24 calculates a time during which the vehicle 1 can maintain the present vehicle speed (hereinafter, also referred to as "vehicle speed maintenance time"). More specifically, the vehicle speed maintenance time can be calculated as follows, for example. Equation (1) for calculating the polarization overvoltage ΔVp is described again.

$$\Delta Vp = (OCV - V_B) - I_B \times (R_{DC} + Rc) \quad (1)$$

It is assumed that the discharging current $I_B$ from the battery 21 remains constant. The cell ECU 24 calculates the actual SOCs (n) after n seconds (=1 second, 2 seconds, 3 seconds) by integrating the discharging current $I_B$ from the present time until n (n is a natural number) seconds. The cell ECU 24 can calculate the OCV(n) after n seconds from the actual SOC(n) after n seconds by referring to SOC-OCV curve. For a voltage $V_B$, it can be assumed, for example, that the voltage drops at a constant rate equal to the drop rate of the present voltage $V_B$. It can also be assumed that ($R_{DC}$+ Rc) is maintained at present. Then, the cell ECU 24 can calculate the polarization overvoltage ΔVp(n) after n seconds according to the above equation (1).

The surface voltage Vs(n) after n seconds is calculated by substituting OCV(n) after n seconds and the polarization overvoltage ΔVp(n) after n seconds into Equation (3) (described again).

$$Vs(n)\Delta = OCV(n) - \Delta Vp(n) \quad (3)$$

The cell ECU 24 calculates the surface SOC(n) after n seconds from the surface voltage Vs(n) after n seconds using the map MP2 (see FIG. 16) (see Equation (4)). Subsequently, the cell ECU 24 calculates the upper limit discharging power Wout after n seconds from the surface-SOC(n) after n seconds using the map MP3 (see FIG. 17). Accordingly, the battery ECU 24 can calculate the time at which the discharge power reaches the upper limit discharge power Wout for the first time when the discharge power from the battery 21 is maintained at the present value. The time from the present time until the time when the discharge power reaches the upper limit discharge power Wout for the first time can be set as the vehicle speed maintenance time. The cell ECU 24 outputs the calculated vehicle speed maintenance times to EV ECU 6.

In S501, the discharge power from the battery 21 is suppressed in accordance with the upper limit discharge power Wout received from the battery ECU 24. This processing is equivalent to the processing of S301 in the second embodiment.

In S502, EV ECU 6 controls HMI 5 (e.g., the instrument panel) to indicate the surface-SOC of the battery 21. Further, in S503, EV ECU 6 controls HMI 5 to indicate the polarization level of the battery 21 in response to the polarization overvoltage ΔVp.

Figure 19:
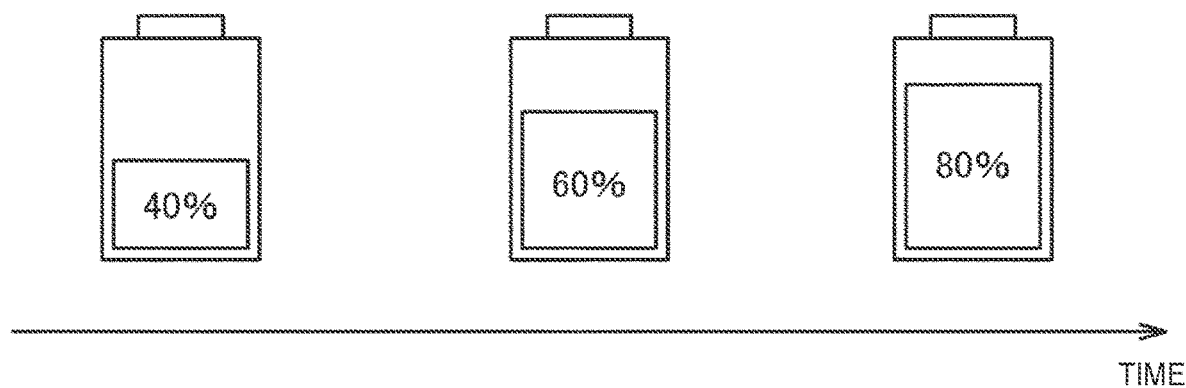
FIG. 19 is a diagram illustrating an example of a display mode of the surface SOC of the battery in the HMI.

FIG. 19 is a diagram illustrating an exemplary mode of displaying the surface-SOC of the battery 21 in HMI 5. For example, the surface SOC can be represented by a meter (bar) and/or a numerical value (percentage) representing the amount of stored electricity in the icon of the battery shape. EV ECU 6 can increase the meter or increase the numerical value as the surface-SOC increases.

During and immediately after the discharge of the battery 21, the surface SOC is displayed low. However, after the discharge of the battery 21 is stopped, the surface SOC increases as time elapses. In this example, the surface SOC is indicated as 40% during the discharge of the battery 21, but after the discharge is stopped, the surface SOC increases as the surface SOC increases by 60% and the surface SOC increases by 80%.

Figure 20:
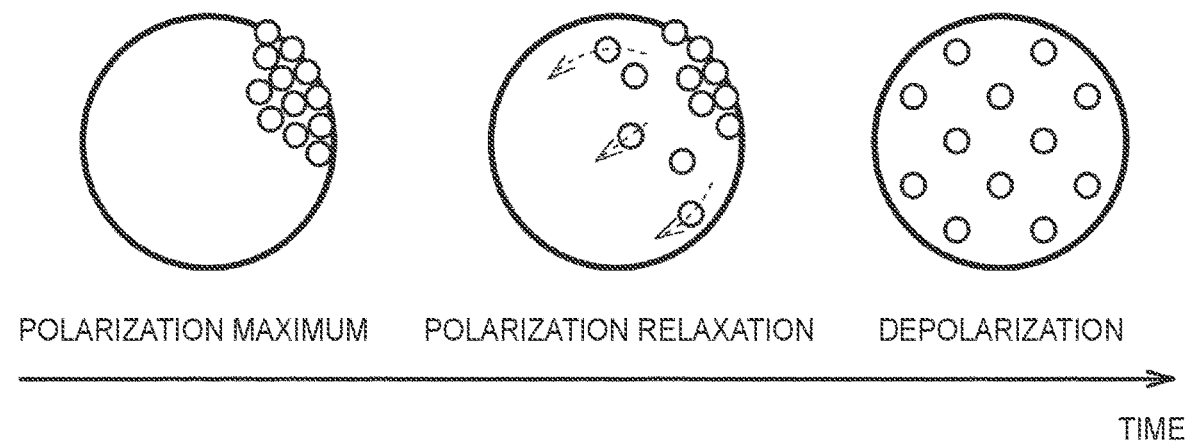
FIG. 20 is a diagram illustrating an example of a display mode of the polarization level of the battery in the HMI.

FIG. 20 is a diagram illustrating an exemplary manner of displaying the polarization-level of the battery 21 in HMI 5. For example, the polarization level of the battery 21 can be expressed by an icon representing the distribution of lithium ions in the positive electrode active material.

In the example shown in FIG. 20, three icons are used. If the polarization overvoltage ΔVp is greater than the first reference value, a left icon is displayed indicating that the lithium ions are unevenly distributed, assuming that a large polarization has occurred. When the polarization overvoltage ΔVp is smaller than the second reference value (<the first reference value), the right icon indicating that the polarization has been eliminated is displayed, indicating that the lithium ions are uniformly distributed. If the polarization overvoltage ΔVp is greater than the second reference value and within a range smaller than the first reference value, a central icon indicating that the lithium ions are diffusing is displayed assuming that the polarization is being relaxed.

By displaying the surface-SOC and/or the polarization-level of the battery 21 on HMI 5, the driver of the vehicle 1 can understand that the polarization of the battery 21 is occurring with discharging at a high current or with continuous discharging. Conversely, the driver can understand that the polarization of the battery 21 is relaxed over time during the period in which the discharge of the battery 21 is stopped.

Returning to FIG. 18, in S504, EV ECU 6 controls HMI 5 to indicate the upper limit discharging power Wout. EV ECU 6 may also display the actual discharge power on HMI 5, or may display the difference between the upper limit discharge power Wout and the actual discharge power on HMI 5. In addition, EV ECU 6 controls HMI 5 to indicate the vehicle speed maintenance times (S505).

When the discharge power from the battery 21 reaches the upper limit discharge power Wout and thus the discharge power is suppressed, there is a possibility that the driver erroneously recognizes that some trouble has occurred in the vehicle 1 (the battery pack 2 or the drive system 3). By displaying the upper limit discharge power Wout on HMI 5, the driver can understand that the discharge power is temporarily suppressed (or can be suppressed). Further, by displaying the vehicle speed maintenance times on HMI 5, the drivers can recognize that the discharging power is suppressed prior to the actual suppression. Therefore, it is possible to suppress the driver from erroneously recognizing that a failure has occurred in the vehicle 1.

It should be noted that EV ECU 6 may simultaneously display the four parameters of the surface-SOC, the polarization-level, the upper-limit discharging power Wout, and the vehicle-speed maintenance-time on HMI 5 or may display them in order. EV ECU 6 may display some of the four parameters, e.g., on the instrument panel, and the rest, e.g., on the HUDs. EV ECU 6 may not display all of the four parameters in HMI 5, and may display only any one, only two, or only three of the four parameters in HMI 5.

As described above, in the third embodiment, at least one of the surface-SOC, the polarization-level, the upper-limit discharging power Wout, and the vehicle-speed maintenance-time of the battery 21 is displayed on HMI 5. By displaying the surface SOC and/or the polarization state of the battery 21, the driver can understand the polarization state of the battery 21. By displaying the upper limit discharge power Wout, the driver can understand the possibility that the discharge power is suppressed. By displaying the vehicle speed maintenance time, the driver can recognize the timing at which the discharge power is suppressed. Therefore, according to the third embodiment, it is possible to prevent the driver from erroneously recognizing that a defect has occurred in the vehicle 1. In addition, the driver can operate the vehicle according to the polarization level of the battery 21.

The embodiments disclosed herein should be considered as illustrative and not restrictive in all respects. The scope of the present disclosure is shown by the claims, rather than the above embodiment, and is intended to include all modifications within the meaning and the scope equivalent to those of the claims.

What is claimed is:

1. A battery system comprising:
    a secondary battery;
    a voltage sensor for detecting a closed circuit voltage of the secondary battery;
    a current sensor for detecting a discharge current from the secondary battery;
    a temperature sensor for detecting a temperature of the secondary battery; and
    a processor for calculating a polarization overvoltage due to discharge of the secondary battery, based on a detection result of the voltage sensor, the current sensor, and the temperature sensor, wherein the processor is configured to calculate the polarization overvoltage by subtracting a voltage drop amount caused by a direct current resistance and a reactive resistance of the secondary battery determined in accordance with a temperature and a state of charge of the secondary battery from a voltage difference between an open circuit voltage of the secondary battery and the closed circuit voltage detected by the voltage sensor.

2. The battery system according to claim 1, further comprising a memory in which a correlation between the temperature of the secondary battery, the state of charge of the secondary battery, and a sum of the direct current resistance and the reactive resistance of the secondary battery is defined, wherein the processor is configured to
    calculate the sum based on the temperature detected by the temperature sensor and the state of charge of the secondary battery by referring to the correlation, and
    calculate the voltage drop amount caused by the direct current resistance and the reactive resistance of the secondary battery by multiplying the sum by the discharge current detected by the current sensor.

3. The battery system according to claim 2, wherein:
    the correlation is defined using the sum when the discharge current from the secondary battery changes over a time period longer than a predetermined time period; and
    the predetermined time period is longer than a time period in which the direct current resistance and the reactive resistance of the secondary battery are able to follow a change in the discharge current from the secondary battery, and is shorter than a time period in which a diffusion resistance of the secondary battery is able to follow a change in the discharge current from the secondary battery.

4. The battery system according to claim 2, wherein:
    the correlation is defined for each deterioration index indicating a degree of deterioration of the secondary battery; and
    the processor is configured to calculate the sum based on the deterioration index in addition to the temperature detected by the temperature sensor and the state of charge of the secondary battery by referring to the correlation.

5. A vehicle comprising:
    the battery system according to claim 1; and
    a power conversion device configured to discharge the secondary battery, wherein the processor is configured to
    subtract the polarization overvoltage from the open circuit voltage of the secondary battery to calculate a surface voltage of the secondary battery, the surface voltage being a voltage that decreases as polarization of the secondary battery progresses, and
    control the power conversion device so as to suppress discharge power from the secondary battery in accordance with the surface voltage.

6. The vehicle according to claim 5, wherein:
    the processor
        calculates a surface state of charge based on the surface voltage, and
        controls the power conversion device so as to suppress the discharge power from the secondary battery based on the surface state of charge; and
    the surface state of charge is a parameter representing the state of charge in a polarization state of the secondary battery by the state of charge in an unloaded state with an equivalent discharging capability.

7. The vehicle according to claim 5, further comprising a display device, wherein the processor is configured to control the display device to cause the display device to display a polarization level of the secondary battery in accordance with the polarization overvoltage.

8. The vehicle according to claim 6, further comprising a display device, wherein the processor is configured to control the display device to display the surface state of charge.

9. The vehicle according to claim 6, further comprising a display device, wherein the processor is configured to control the display device to cause the display device to display an upper limit discharge power from the secondary battery, the upper limit discharge power being set in accordance with the surface state of charge.

10. The vehicle according to claim 5, further comprising a display device, wherein the processor is configured to calculate a travel time during which the vehicle is able to maintain a current vehicle speed, and to control the display device to cause the display device to display a calculated result.

11. A method for monitoring a secondary battery by a computer, the method comprising:
    calculating, by the computer, a difference between an open circuit voltage and a closed circuit voltage of the secondary battery;

calculating, by the computer, a voltage drop amount caused by a direct current resistance and a reactive resistance of the secondary battery determined in accordance with a temperature and a state of charge of the secondary battery; and calculating, by the computer, a polarization overvoltage that is a voltage drop amount due to polarization caused by discharge of the secondary battery, by subtracting the voltage drop amount from the difference.

* * * * *